(12) United States Patent
Nishi et al.

(10) Patent No.: US 9,672,103 B2
(45) Date of Patent: Jun. 6, 2017

(54) DECODING DEVICE, DECODING METHOD, AND MEMORY SYSTEM

(71) Applicant: KABUSHIKI KAISHA TOSHIBA, Tokyo (JP)

(72) Inventors: Yoshifumi Nishi, Kanagawa (JP); Takao Marukame, Tokyo (JP); Yuichiro Mitani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 14/847,576

(22) Filed: Sep. 8, 2015

(65) Prior Publication Data
US 2016/0085626 A1    Mar. 24, 2016

(30) Foreign Application Priority Data
Sep. 22, 2014 (JP) .................. 2014-192611

(51) Int. Cl.
*H03M 13/03* (2006.01)
*G06F 11/10* (2006.01)
(Continued)

(52) U.S. Cl.
CPC ..... *G06F 11/1068* (2013.01); *H03M 13/1125* (2013.01); *H03M 13/6597* (2013.01)

(58) Field of Classification Search
CPC .......... H03M 13/1111; H03M 13/1117; H03M 13/1171; H03M 13/6331; H03M 13/1125
See application file for complete search history.

(56) References Cited

U.S. PATENT DOCUMENTS 8,856,625 B2    10/2014 Miyashita
2005/0262420 A1*  11/2005 Park .................. H03M 13/6566
                                                            714/758
(Continued)

FOREIGN PATENT DOCUMENTS

JP    2007-020068    1/2007
JP    2008-154202    7/2008
(Continued)

OTHER PUBLICATIONS

Gu, Ming et al., "A 100 pJ/bit, (32,8) CMOS Analog Low-Density Parity-Check Decoder Based on Margin Propagation", IEEE Journal of Solid-State Circuits, vol. 46, No. 6, pp. 1433-1442, (2011).
(Continued)

*Primary Examiner* — David Ton
(74) *Attorney, Agent, or Firm* — Finnegan, Henderson, Farabow, Garrett & Dunner, L.L.P.

(57) ABSTRACT

According to an embodiment, a decoding device includes a check node processor, and a converter. The probability acquirer is configured to acquire. The check node processor is configured to perform check node processing during in a decoding operation of encoded data. A probability value for each bit of the encoded data is treated as an initial variable node in the check node processing. The converter is configured to convert, into bit values, updated values of the probability values based on the check node processing. The check node processor includes a check node circuit having a topology corresponding to a two-state trellis diagram representing the check node processing. The check node circuit includes conducting wires each corresponding to an edge of the two-state trellis diagram and includes switch units which are arranged on the conducting wires and switching of which is controlled according to a predetermined probability.

18 Claims, 27 Drawing Sheets

(51) Int. Cl.
*H03M 13/11* (2006.01)
*H03M 13/00* (2006.01)

(56) References Cited

U.S. PATENT DOCUMENTS

| | | |
|---|---|---|
| 2008/0028281 A1 | 1/2008 | Miyazaki et al. |
| 2008/0294970 A1 | 11/2008 | Gross et al. |
| 2009/0037799 A1* | 2/2009 | Liu .................... H03M 13/1114 714/800 |
| 2011/0295786 A1* | 12/2011 | Reynolds ........... H03M 13/1111 706/46 |
| 2014/0173385 A1* | 6/2014 | Li ..................... H03M 13/1111 714/780 |

FOREIGN PATENT DOCUMENTS

| | | |
|---|---|---|
| JP | 4425282 | 12/2009 |
| JP | 2013-198052 | 9/2013 |
| JP | 5402630 | 11/2013 |
| WO | WO 2006/075417 | 7/2006 |
| WO | WO 2008/149808 | 12/2008 |

OTHER PUBLICATIONS

Tehrani, Saeed S. et al., "Stochastic Decoding of LDPC Codes", IEEE Communications Letters, vol. 10, No. 10, pp. 716-718, (2006).

* cited by examiner (a)

(b)

(a)

(b)

(a)

(b)

(a)

(b)

DECODING DEVICE, DECODING METHOD, AND MEMORY SYSTEM

CROSS-REFERENCE TO RELATED APPLICATION

This application is based upon and claims the benefit of priority from Japanese Patent Application No. 2014-192611, filed on Sep. 22, 2014; the entire contents of which are incorporated herein by reference.

FIELD

Embodiments described herein relate generally to a decoding device, a decoding method, and a memory system.

BACKGROUND

An LDPC code (LDPC stands for Low-Density Parity-Check) is known as an encoding method that has a strong error correction/encoding capacity and that is used in communication systems and memory devices. An LDPC code uses a parity check matrix and repeatedly performs message value calculation called row processing and column processing; and performs decoding by obtaining the posterior probability of received-word data. From among the existing types of error correction codes, an LDPC code has the error correction capacity close to the theoretical limit. For that reason, the LDPC code is widely used in communication systems and storage devices.

Meanwhile, regarding the flash memory that, in recent years, has become mainstream as far as nonvolatile semiconductor memory devices are concerned, miniaturization of memory cells and multi-bit per cell architecture have escalated the errors occurring during reading. For that reason, the error correction capacity of the conventional BCH code (BCH stands for Bose, Chandhuri, Hocquenghem) has become insufficient. Thus, in recent years, a lot of attention is being focused on the LDPC codes having a higher error correction capacity. Besides, in order to retain the intergenerational compatibility among the error correction methods, there has been a demand for a technology providing an on-chip decoding circuit for decoding the LDPC codes. As a result of providing an on-chip decoding technology, the LDPC code decoding operation can be performed using a circuit arranged on the chip on which the semiconductor memory device is formed. As a result, the apparent error occurrence rate of the semiconductor memory device can be held down to a certain level or lower.

Meanwhile, since an LDPC code performs probability-based error correction, it becomes necessary to perform complex real number calculation. Particularly, in the check node processing performed during the calculations for decoding an LDPC code, it is necessary to perform product-sum operations of probability values, thereby requiring a large amount of calculation resources. Hence, in order to implement the decoding operation for an LDPC code using hardware, a large-scale digital semiconductor circuit is required. That makes on-chip implementation a difficult task.

In that regard, in order to downscale the semiconductor circuit that performs decoding of an LDPC code, a method has been proposed in which the real numbers are expressed as electrical current and the real number calculation is performed using analog circuitry. However, in the case of expressing data values as electrical current, electrical current must continuously flow during the data processing. That leads to consumption of an enormous amount of electrical power.

In this way, in order to achieve a sufficient error correction capacity in an LDPC code using the conventional technology, it is necessary to perform the decoding operation using real number calculation. However, because of that, it becomes complex to implement an error correction device using a semiconductor integrated circuit.

DETAILED DESCRIPTION

According to an embodiment, a decoding device includes a probability acquirer, a check node processor, and a converter. The probability acquirer is configured to acquire a probability value for each bit of encoded data received. The check node processor is configured to perform check node processing during in a decoding operation of the encoded data. The probability values are treated as initial variable nodes in the check node processing. The converter is configured to convert, into bit values, updated values of the probability values which are updated based on a result of the check node processing. The check node processor includes a check node circuit having a topology corresponding to a two-state trellis diagram representing the check node processing. The check node circuit includes conducting wires each corresponding to an edge of the two-state trellis diagram and includes switch units which are arranged on the conducting wires and switching of which is controlled according to a predetermined probability. Based on presence or absence of conduction between a first terminal in the check node circuit corresponding to a starting node of the two-state trellis diagram and a second terminal in the check node circuit corresponding to an end node of the two-state trellis diagram, the check node processor performs check node processing with respect to the variable nodes corresponding to the check node circuit.

Figure 1:
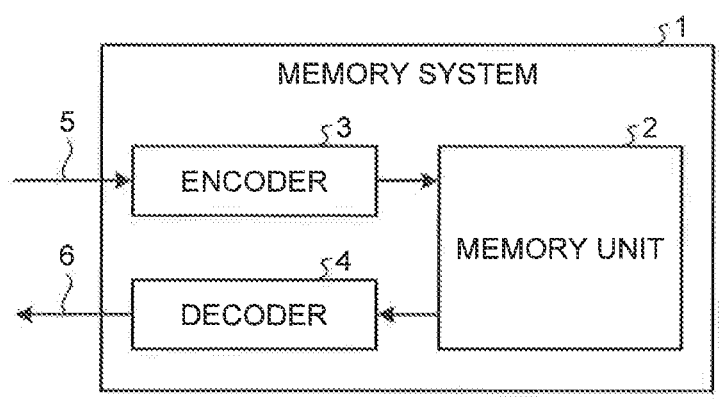
FIG. 1 is a block diagram schematically illustrating an exemplary configuration of a memory system that includes a decoding device according to embodiments.

Given below is the explanation about a decoding device according to embodiments. The decoding device according to the embodiments performs decoding of a low-density parity-check code (LDPC code). In FIG. 1 is schematically illustrated an exemplary configuration of a memory system that includes a decoding device according to the embodiments.

With reference to FIG. 1, a memory system 1 includes a memory unit 2, an encoder 3, and a decoder 4. Firstly, input data 5 is input to the encoder 3. Then, the encoder 3 encodes the input data 5 into an LDPC code, and sends the LDPC code to the memory unit 2 that includes, for example, a controller and a memory medium. Thus, the LDPC code that is sent to the memory unit 2 is written in the memory medium by the controller. In the embodiments, it is assumed that a flash memory is used as the memory medium.

Meanwhile, for example, when the memory unit 2 receives a read request from outside, the controller reads the LDPC code from the memory medium and sends it to the decoder 4. Then, the decoder 4 decodes the LDPC code; restores the original input data 5; and outputs the restored input data 5 as output data 6 from the memory system 1.

When a flash memory is used as the memory medium, reading of information is done depending on whether the threshold voltage is high or low.

Given below is the explanation about LDPC codes. An LDPC code is characterized by a low-density matrix called a check matrix in which majority of the components are equal to 0 and only a small number of components are equal to 1. Depending on the code length, a large check matrix is required. However, for the sake of illustration, the following explanation is given about an 8×4 check matrix. An example of a check matrix H is given below in Equation (1).

$$H = \begin{bmatrix} 0 & 1 & 0 & 1 & 1 & 0 & 0 & 1 \\ 1 & 1 & 1 & 0 & 0 & 1 & 0 & 0 \\ 0 & 0 & 1 & 0 & 0 & 1 & 1 & 1 \\ 1 & 0 & 0 & 1 & 1 & 0 & 1 & 0 \end{bmatrix} \quad (1)$$

In the check matrix H, the count of 1 present in each row and each column is called weight, and the check matrix is created in such a way that the weights in all columns and all rows are greater than zero. When the column weight and the row weight are constant values, the check matrix is called a regular matrix. In the check matrix H given in Equation (1), all column weights are equal to four and all row weights are equal to two. Hence, the check matrix H is a regular matrix.

In the LDPC method, a data string x that is to be sent through a communication path or that is to be stored in a memory is converted into a data string c that satisfies $Hc^T=0$. This data string c is called a code. Thus, in the LDPC method, the data used in information processing is not the original data string x but is the code c obtained by conversion. The encoder 3 performs a conversion operation with respect to the data string containing the input data 5. The memory unit 2 writes the code c, which is obtained by conversion of the input data 5, in the flash memory.

Generally, the code c represents a data sting having a greater data length than the data string x and contains, in addition to the information included in the data string x, information required in performing error correction. Meanwhile, encoding itself represents mapping with one-to-one correspondence. Thus, if the data string z is provided, the code gets uniquely determined. Conversely, if the code c is provided, the original data string x gets uniquely determined. Moreover, (the length of the data string x)/(the length of the code c) is called a code rate. Herein, it can be said that, higher the code rate, the higher is the efficiency of the error correction.

Figure 2:
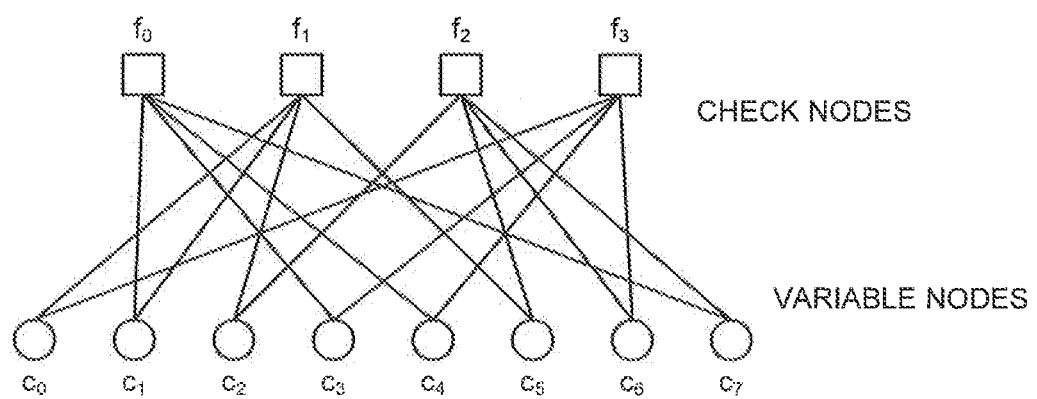
FIG. 2 is a diagram illustrating an exemplary Tanner graph expressing a check matrix.

The check matrix H can be expressed using a Tanner graph illustrated in FIG. 2. In the Tanner graph, nodes $\{c_0, c_1, \ldots, c_7\}$ are arranged below nodes $\{f_0, f_1, f_2, f_3\}$. Then, regarding a component $h_{ij}$ of the check matrix H, only when the component $h_{ij}=1$ holds true, the nodes are connected by straight lines. In the Tanner graph, nodes $\{c_k\}$ are called variable nodes, and nodes $\{f_j\}$ are called check nodes. Each of the variable nodes $c_i$ corresponds to a row of the check matrix H; and the row numbers of the rows having the value "1" matches with the numbers assigned to the check nodes $f_j$ that are connected to the concerned variable node $c_i$. On the other hand, each of the check nodes $f_j$ corresponds to a column of the check matrix H; and the column numbers of the columns having the value "1" matches with the numbers assigned to the variable nodes $c_i$ that are connected to the concerned check node $f_j$.

Given below is the explanation of the basic decoding operation performed with respect to an LDPC code. Herein, the explanation is given with reference to the belief propagation (BP) method. It is assumed that the decoding operation explained below is performed by, for example, the decoder 4. Thus, the decoder 4 reads the code stored in the memory unit 2, decodes the code, and restores the original data.

Figure 3:
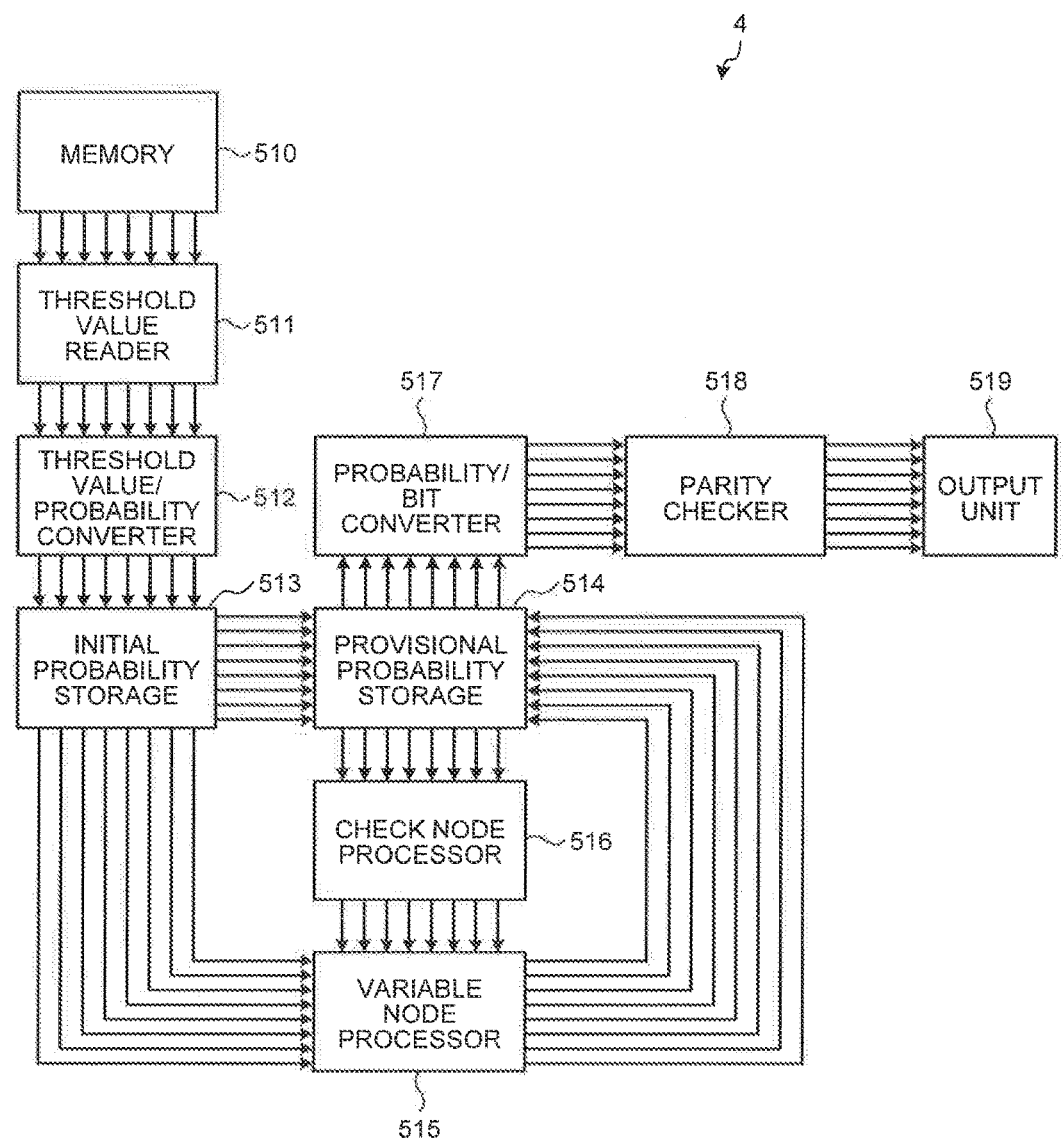
FIG. 3 is a block diagram illustrating an exemplary configuration of a decoder that can be implemented in the embodiments.

In FIG. 3 is illustrated an exemplary configuration of the decoder 4 that can be implemented in the embodiments. The decoder 4 includes a threshold value reader 511, a threshold value/probability converter 512, an initial probability storage 513, a provisional probability storage 514, a variable node processor 515, a check node processor 516, a probability/bit converter 517, and a parity checker 518.

With reference to FIG. 3, a memory 510 corresponds to the memory unit 2 illustrated in FIG. 1; and the threshold value reader 511 reads, from the memory unit 2, the threshold voltage during reading. Based on the threshold voltage obtained by the threshold value reader 511, the threshold value/probability converter 512 obtains, with respect to the bit string that has been read, a bit-by-bit probability indicating the likelihood; and converts the threshold voltage into a probability. Herein, the bit-by-bit probability value obtained by the threshold value/probability converter 512 is stored in the initial probability storage 513.

The probability values stored in the initial probability storage 513 are stored as provisional probabilities in the provisional probability storage 514 and are sent to the variable node processor 515. The check node processor 516 refers to the provisional probabilities read from the provisional probability storage 514; distributes the provisional probabilities in groups according to the check matrix H; performs probability calculation in each group by following encoding rules; and performs calculations of the check node processing. The variable node processor 515 receives a notification from the check node processor 516 about the group-by-group check node processing result and tallies the results. Then, the variable node processor 515 updates the probability values stored in the provisional probability storage 514 with the post-tallying probability values.

The probability/bit converter 517 determines whether or not the probability values stored in the provisional probability storage 514 are satisfying the parity condition. If the probability values are satisfying the parity condition, then the probability/bit converter 517 converts the probability values into bit values and obtains a bit string. Herein, until the determination result indicates that the parity condition is satisfied, the check node processor 516 repeatedly performs the check node processing. The parity checker 518 performs a parity check with respect to the bit string obtained by conversion by the probability/bit converter 517 and, if no error is detected, sends the bit string to an output unit 519 that includes, for example, a buffer memory.

Figure 4:
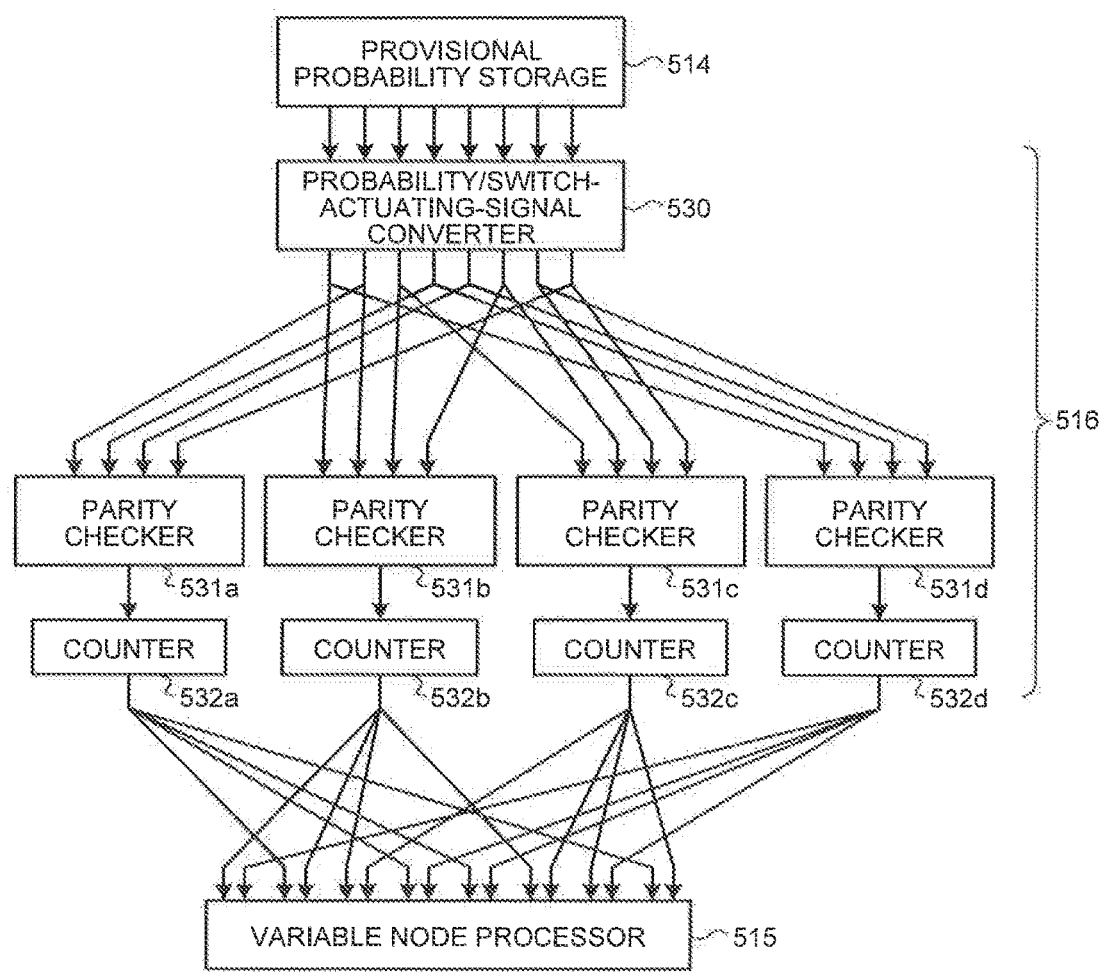
FIG. 4 is a block diagram illustrating an exemplary configuration of a check node processor that can be implemented in the embodiments.

In FIG. 4 is illustrated an exemplary configuration of the check node processor 516 that can be implemented in the embodiments. In FIG. 4, the common portion with FIG. 3 is referred to by the same reference numerals and the detailed explanation is not repeated. The check node processor 516 includes a probability/switch-actuating-signal converter 530; a plurality of parity checkers 531a to 531d; and counters 532a to 532d that are supplied with the output of the parity checkers 531a to 531d, respectively.

The probability/switch-actuating-signal converter 530 distributes the provisional probability values, which are stored in the provisional probability storage 514, according to the check matrix H and sends them to the parity checkers 531a to 531d. Using the received probability values, the parity checkers 531a to 531d perform the check node processing, that is, perform probability calculation according to encoding rules. Then, the counters 532a to 532d count the results of calculation; and the variable node processor 515 tallies the counting results of the counters 532a to 532d according to the check matrix H.

Given below is the more detailed explanation about the basic decoding operation performed in the LDPC code. Firstly, regarding $\{y_i\}$ that represents a column y having a particular physical quantity, each variable node $c_i$ receives a probability $Q_{0i}$ having "0" as the digital value corresponding to the value $y_i$. Herein, the digital data values that are stored are, for example, the original data values of the code stored in the memory unit 2. Then, each variable node $c_i$ sends, as information $q_{ij}$, the probability $Q_{0i}$ to a check node $f_j$ to which that variable node $c_i$ is connected (see (a) in FIG. 5).

Figure 5:
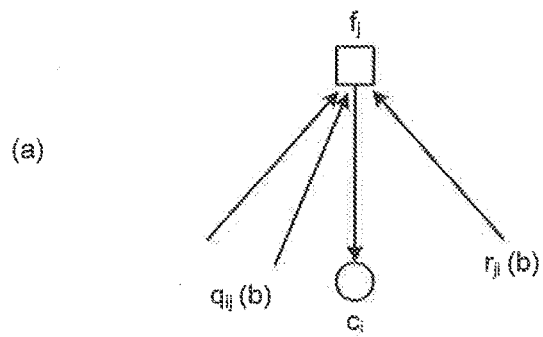
FIG. 5 is a diagram for explaining check node processing that can be implemented in the embodiments.
Figure 5:
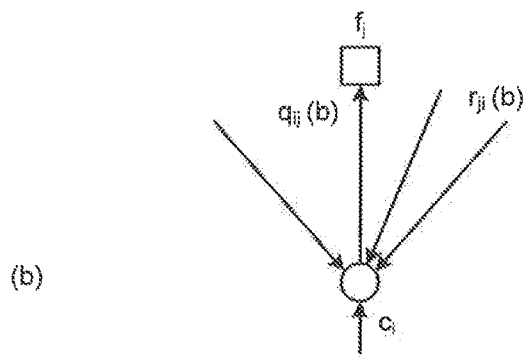

The check node $f_j$ calculates, based on information $q=\{q_{ij}, q_{kj}, \ldots\}$ sent from the variable nodes $\{c_i, c_k, \ldots\}$ connected thereto and by taking into account the parity condition, probabilities $\{r_{ji}, r_{jk}, \ldots\}$ at which the variable nodes $\{c_i, c_k, \ldots\}$ have "1" as the digital data value; and sends back the probabilities $\{r_{ji}, r_{jk}, \ldots\}$ to the variable nodes $\{c_i, c_k, \ldots\}$ (see (b) in FIG. 5).

At the time of calculating the probability $r_{ji}$ that is to be sent back to the variable node $c_i$, the check node $f_j$ excludes the information $q_{ij}$ received from the variable node $c_i$. That is, as a result of receiving the probability $r_{ji}$, the variable node $c_i$ receives information of the variable nodes except for itself. More particularly, the check node $f_j$ performs the check node processing according to Equation (2) given below and calculates the probability $r_{ji}$. In Equation (2), a value A(j) represents a set of subscripts $\{i, k, \ldots\}$ of the variable nodes that are connected to the check node $f_j$.

$$r_{ji} = \frac{1}{2} + \frac{1}{2} \prod_{k \in A(j)-(i)} (1 - 2q_{kj}) \quad (2)$$

The variable node $c_i$ refers to the probabilities $\{r_{ji}, r_{ki}, \ldots\}$, which are received from the check nodes $\{f_j, f_k, \ldots\}$ connected thereto, as well as refers to its own probability $Q_{0i}$; and calculates a probability $Q'_i$ at which the value of the received data was originally equal to "0". As a result of calculations, if the probability $Q'_i$ is equal to or greater than half, then the variable node $c_i$ presumes that the value of the received data is "1". However, if the probability $Q'_i$ is smaller than half, then the variable node $c_i$ presumes that the value of the received data is "0".

During the error correction according to the LDPC method, the parity check is performed using the presumed value. More particularly, with respect to a presumed-value string $c_{temp} = \{c_{0temp}, c_{1temp}, \ldots\}$, it is determined whether or not $Hc_{temp}^T = 0$ holds true. If $Hc_{temp}^T = 0$ holds true, calculations are ended under the estimation that the presumed-value string is a digital data string in which the presumed value $c_{temp}$ was stored. However, if $Hc_{temp}^T = 0$ does not hold true, then the variable node $c_i$ recalculates the information $q = \{q_{ij}, q_{kj}, \ldots\}$ and sends the calculation result to the check nodes $\{f_j, f_k, \ldots\}$ (see (b) in FIG. 5).

Herein, the information $q_{ij}$ that is sent from the variable node $c_i$ to the check node $f_j$ represents "the probability at which the value of digital data of the variable node $c_i$ is equal to 1". That information is not included in the information $r_{ji}$ received from the check node $f_j$. That is, as a result of receiving the information $q_{ij}$, the check node $f_j$ receives information on the check nodes except for itself.

Upon receiving the information q, the check node calculates the probability r based on the received information q, and returns a variable node. This abovementioned algorithm is repeatedly implemented until the parity condition is satisfied. That is, the presumed-value string $c_{temp}$ is updated using the calculated probability r; and, until $Hc_{temp}^T = 0$ holds true with respect to the updated presumed-value string $c_{temp}$, the algorithm is repeatedly implemented.

Consider the case of Equation (2) given earlier. In Equation (2), a variable $q_{kj}$ represents the provisional probability that provisionally indicates the probability at which the value of the variable node k is equal to "0". A provisional probability $p_{kj}$ at which the value of the variable node k is equal to "1" is provided by $(1-q_{kj})$. Thus, $p_{kj} + q_{kj} = 1$ holds true. If that equation is substituted in Equation (2), Equation (3) given below is obtained.

$$r_{ji} = \frac{1}{2} + \frac{1}{2} \prod_{k \in A(j)-(i)} (p_{jk} - q_{kj}) \quad (3)$$

In Equation (3) given above, when the second term on the right-hand side is expanded, each term becomes equal to the product of the probability p and the probability q. Moreover, the term including an even number of probabilities q becomes a positive term, while the term including an odd number of probabilities q becomes a negative term. According to the definition, the probability q represents the probability at which the value of the original variable node is equal to "1". Hence, when the number of included probabilities q is even, it indicates that an even number of "1" are included and that the parity is satisfied. In contrast, the term including an odd number of "1" corresponds to the case of violating the parity.

In the following explanation, for the sake of illustration, it is assumed that five variable nodes, namely, $c_i$, $c_1$, $c_2$, $c_3$, and $c_4$ are connected to the check node $f_j$. However, that is not the only possible example. That is, even if the variable nodes connected to a single check node are not five in number, the following explanation is applicable.

With the aim of avoiding complications, if the subscript "j" of the variables $q_{kj}$ and $p_{kj}$ is omitted, the second term on the right-hand side of Equation (3) can be expressed as Equation (4) given below.

$$\prod_{k \in (1,2,3,4)} (p_k - q_k) = \quad (4)$$

$$(p_1 - q_1)(p_2 - q_2)(p_3 - q_3)(p_4 - q_4) = p_1 p_2 p_3 p_4 + p_1 p_2 q_3 q_4 +$$

$$p_1 q_2 p_3 q_4 + p_1 q_2 q_3 p_4 + q_1 p_2 p_3 q_4 + q_1 p_2 q_3 p_4 + q_1 q_2 p_3 p_4 +$$

$$q_1 q_2 q_3 q_4 - p_1 p_2 p_3 q_4 - p_1 p_2 q_3 p_4 - p_1 q_2 p_3 p_4 -$$

$$q_1 p_2 p_3 p_4 - p_1 q_2 q_3 q_4 - q_1 p_2 q_3 q_4 - q_1 q_2 p_3 q_4 - q_1 q_2 q_3 p_4$$

As is clear from Equation (4), the term including an even number of "p" becomes a positive term, and the term including an odd number of "p" becomes a negative term. Moreover, the probability $r_{ji}$ represents the difference between the sum of probabilities of satisfying the parity condition and the sum of probabilities of parity violation. If the positive terms in the anterior half on the right-hand side of Equation (4) are written as (even 1, 2, 3, 4) and if the negative terms in the posterior half on the right-hand side of Equation (4) are written as (odd 1, 2, 3, 4), then (even 1, 2, 3, 4)+(odd 1, 2, 3, 4)=1 holds true. By taking that into account, Equation (3) can be expressed as Equation (5) given below.

$$r_{ji} = \frac{1}{2} \{(\text{even } 1, 2, 3, 4) + (\text{odd } 1, 2, 3, 4)\} + \quad (5)$$

$$\frac{1}{2} \{(\text{even } 1, 2, 3, 4) - (\text{odd } 1, 2, 3, 4)\} = (\text{even } 1, 2, 3, 4)$$

As is clear from Equation (5), the probability $r_{ji}$ represents the probability at which an even number of variable nodes having the value "1" are included among the variable nodes $c_1$, $c_2$, $C_3$, and $c_4$. That is, the probability $r_{ji}$ represents the probability at which the variable node $c_i$ should be equal to "0" as obtained from the information of the variable nodes $c_1$, $c_2$, $c_3$, and $c_4$. Meanwhile, the probability at which the variable node $c_i$ should be equal to "1" is the probability $(1-r_{ji})$. Thus, the probability at which the currently-provided value of the variable node $c_i$ should be reversed is: (the probability at which the variable node $c_i$ should be equal to "0")×(the probability at which the variable node $c_i$ is currently equal to "1")+(the probability at which the variable node $c_i$ should be equal to "1")×(the probability at which the variable node $c_i$ is currently equal to "0"). That is expressed in Equation (6) given below.

$$p_i r_{ji} + q_i(1 - r_{ji}) = p_i(\text{even } 1, 2, 3, 4) + q_i(\text{odd } 1, 2, 3, 4) = \quad (6)$$

$$\frac{1}{2}\{p_i(\text{even } 1, 2, 3, 4) + q_i(\text{odd } 1, 2, 3, 4) +$$

$$p_i(\text{odd } 1, 2, 3, 4) + q_i(\text{even } 1, 2, 3, 4)\} +$$

$$\frac{1}{2}\{p_i(\text{even } 1, 2, 3, 4) + q_i(\text{odd } 1, 2, 3, 4) -$$

$$p_i(\text{odd } 1, 2, 3, 4) - q_i(\text{even } 1, 2, 3, 4)\} =$$

$$\frac{1}{2} + \frac{1}{2}(p_i - q_i)\{(\text{even } 1, 2, 3, 4) - (\text{odd } 1, 2, 3, 4)\} =$$

$$\frac{1}{2} + \frac{1}{2}(p_i - q_i)(p_1 - q_1)(p_2 - q_2)(p_3 - q_3)(p_4 - q_4)$$

If the second term of Equation (6) is expanded, it takes the form of (the sum of terms having an odd number of "p")–(the sum of terms having an even number of "p") in an identical manner to Equation (5) given earlier. Herein, it is assumed that the sum of terms having an odd number of "p" is written as (odd i, 1, 2, 3, 4) and the sum of terms having an odd number of "p" is written as (even i, 1, 2, 3, 4). If attention is given to the fact that (odd i, 1, 2, 3, 4)+(even i, 1, 2, 3, 4)=1 holds true, then Equation (6) is expressed as Equation (7) given below.

$$\frac{1}{2} + \frac{1}{2}\{(\text{odd } i, 1, 2, 3, 4) - (\text{even } i, 1, 2, 3, 4)\} = \quad (7)$$

$$\frac{1}{2}\{(\text{odd } i, 1, 2, 3, 4) + (\text{even } i, 1, 2, 3, 4)\} +$$

$$\frac{1}{2}\{(\text{odd } i, 1, 2, 3, 4) - (\text{even } i, 1, 2, 3, 4)\} = (\text{odd } i, 1, 2, 3, 4)$$

Since the sum (odd i, 1, 2, 3, 4) represents the sum of terms having an odd number of "p", it is equal to the probability at which the set of values of the variable nodes $c_i$, $c_1$, $c_2$, $c_3$, and $c_4$ violates the parity condition. Thus, in Equation (7), the check node $f_j$ is determined to be incorrect with the probability at which the current value of the variable node $c_i$ violates the parity condition, and is determined to be correct with the probability at which the current value of the variable node $c_i$ satisfies the parity condition.

Since "the probability of satisfying the parity" and "the probability at which the current $c_i$=0 holds true" are known; "the probability at which $c_i$=0 should hold true" can be easily calculated from Equation (6) and Equation (7) given earlier.

Figure 6:
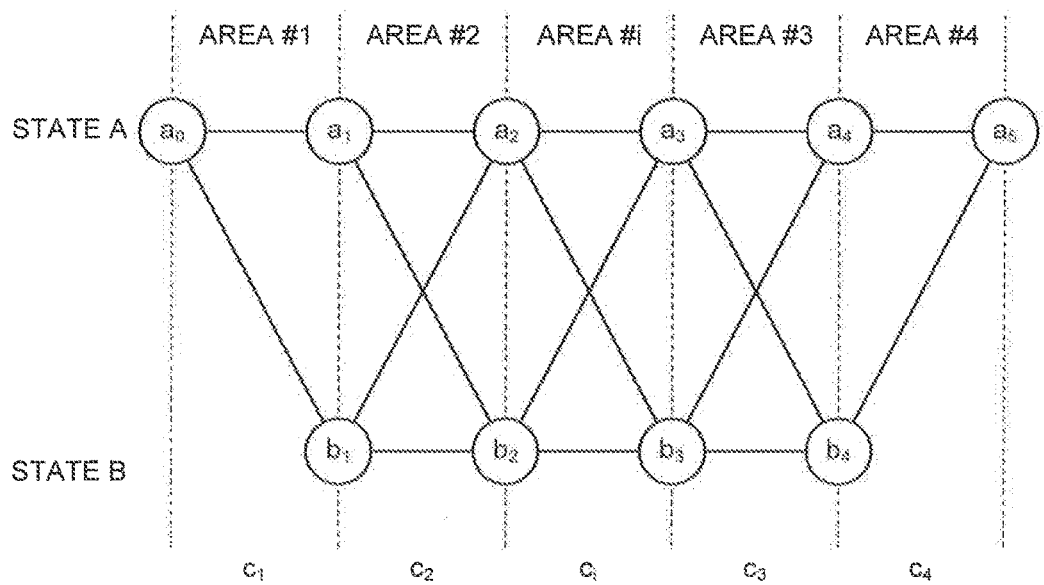
FIG. 6 is a two-state trellis diagram that can be implemented in the embodiments.

In order to visually illustrate the check node processing explained above, a two-state trellis diagram is introduced as illustrated in FIG. 6. The two-state trellis diagram illustrated in FIG. 6 includes six nodes $a_0$ to $a_5$ arranged in the upper part and four nodes $b_0$ to $b_4$ arranged in the lower part. The upper part is referred to as a state A, and the lower part is referred to as a state B. Moreover, areas #1, #2, #i, #3, and #4 that are separated at the positions of the nodes $a_0$ to $a_5$ by vertical dashed lines correspond to the variable nodes $c_1$, $c_2$, $c_i$, $c_3$, and $c_4$, respectively.

Herein, the sequence of the areas #1, #2, #i, #3, and #4 illustrated in FIG. 6 is not limited to this example. That is, any other sequence can also be used. For example, even if the area #i corresponding to the variable node $c_i$ is present at the left end, it does not affect the final result.

Consider the discrete-time stochastic process from the node $a_0$ toward the node $a_5$. At the first step, transition occurs from the node $a_0$ to either the node $a_1$ or the node $b_1$. At that time, a probability $q_1$ represents the probability of transition from the node $a_0$ to the node $a_1$, while a probability $p_1$=1–$q_1$ represents the probability of transition from the node $a_0$ to the node $b_1$. If transition occurs from the node $a_0$ to node $a_1$; then, at the next step, transition occurs from the node $a_1$ to either the node $a_2$ or the node $b_2$. At that time, a probability $q_2$ represents the probability of transition from the node $a_1$ to the node $a_2$, while a probability $p_2$=1–$q_2$ represents the probability of transition from the node $a_1$ to the node $b_2$.

Herein, in the case in which sets of nodes ($a_x$, $b_x$) and ($a_y$, $b_y$) having an identical transition step are facing each other across an area z, transition occurring from the node $a_x$ to the node $a_y$ (transition occurring from the state A to the state A) as well as the probability of transition occurring from the node $b_x$ to the node $b_y$ (transition occurring from the state B to the state B) is assumed to have a probability $q_z$. In an identical manner, transition occurring from the node $a_x$ to the node $b_y$ (transition occurring from the state A to the state B) as well as the probability of transition occurring from the node $b_x$ to the node $a_y$ (transition occurring from the state B to the state A) is assumed to have a probability $p_z$. That is, with reference to FIG. 6, the probability $q_z$ represents the probability of transition occurring in the horizontal direction, and the probability $p_z$ represents the probability of transition occurring in an oblique direction.

Figure 7:
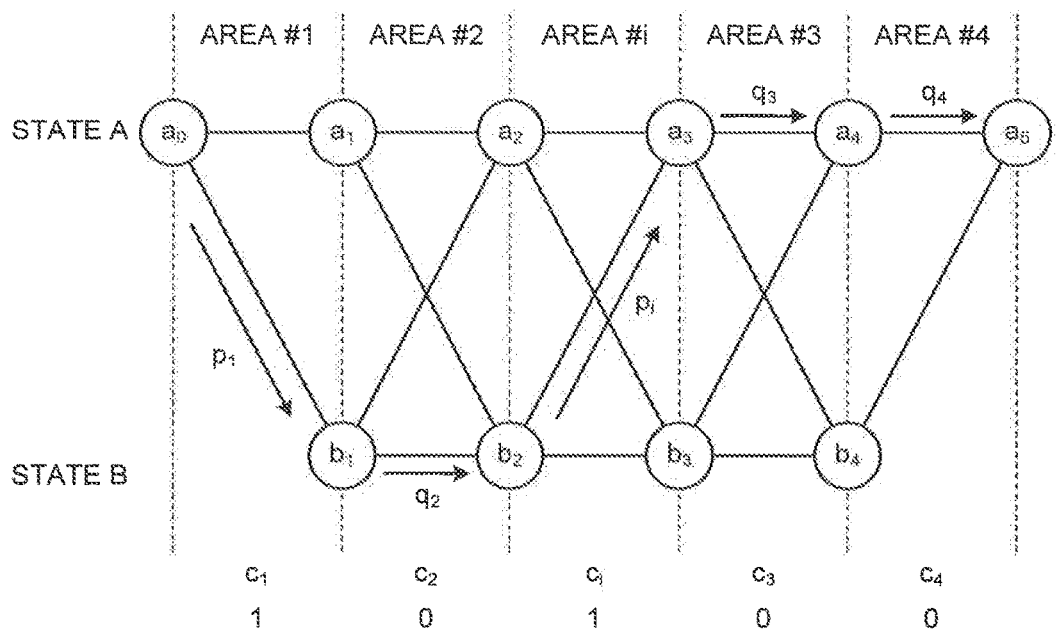
FIG. 7 is a diagram illustrating an exemplary path starting from the starting node to the end node in a two-state trellis diagram.

In the two-state trellis diagram illustrated in FIG. 2, as a result of the stochastic process, paths from the node $a_0$ to the node $a_5$ are formed. In the example illustrated in FIG. 6, the node $a_0$ serves as the starting node and the node $a_5$ serves as the end node of the paths. In FIG. 7 is illustrated an exemplary path starting from the node $a_0$ to the node $a_5$. In the example illustrated in FIG. 7, transition occurs from the node $a_0$ to the node $b_1$ and from the node $b_1$ to the node $b_2$. Moreover, transition occurs from the node $b_2$ to the node $a_3$ and from the node $a_3$ to the node $a_4$. The probability at which the path illustrated in FIG. 7 is achieved is provided by a probability ($p_1 q_2 p_i q_3 q_4$). When "p" is set to 1 and "q" is set to 0 as described above, the probability ($p_1 q_2 p_i q_3 q_4$) corresponds to the variable nodes $\{c_1, c_2, c_i, c_3, c_4\}$=(10100).

With reference to FIGS. 6 and 7, in the paths starting from the node $a_0$ to the node $a_5$; since the node $a_0$ as well as the node $a_5$ is in the state A, when a transition to the state B occurs once, there needs to be a return transition to the state A. That is, inter-state transition always occurs for an even number of times. In other words, in the equation of probability in the case of achieving a path from the starting node to the end node, the character "p" is certainly included for an even number of times. It corresponds to the fact that, in a variable node, "1" is included for an even number of times thereby satisfying the parity condition. As described above, since "the probability at which $c_i$=0 holds true" is known, "the probability at which $c_i$=0 should hold true" can be obtained with ease. In this way, the method of considering a path in a trellis diagram and calculating the probability along that path is called the BCJR algorithm (BCJR stands for Bahl, Cocke, Jelinek, and Raviv).

On the premise of the explanation given above, explanation of the embodiments is given below.

First Embodiment

Figure 8:
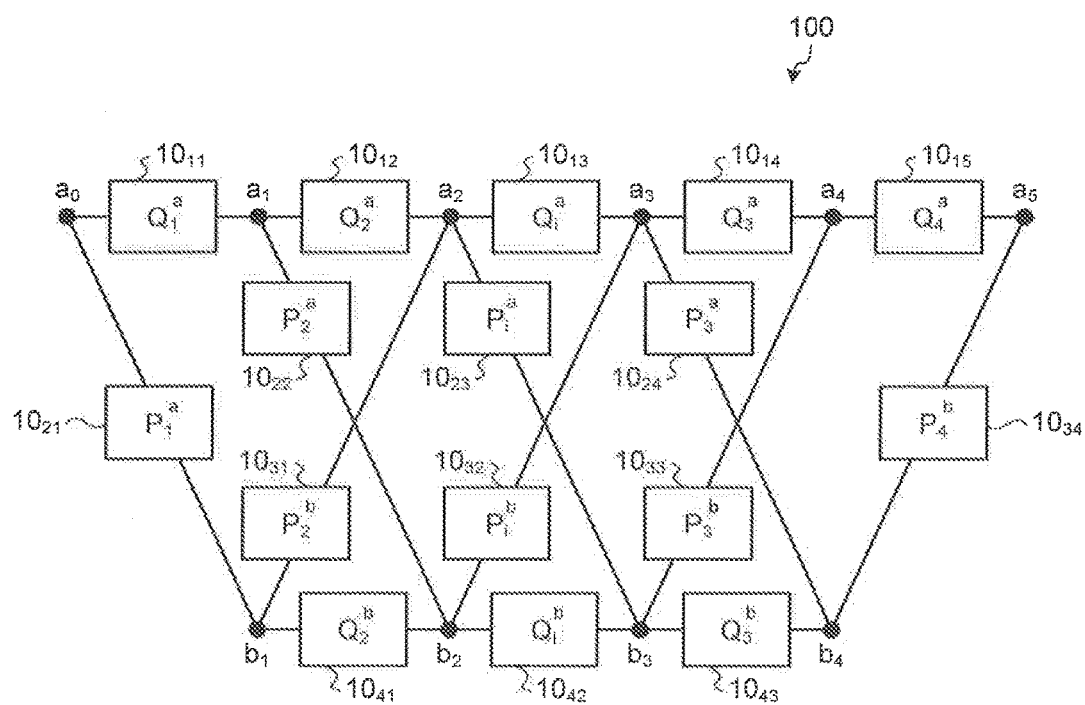
FIG. 8 is a diagram illustrating an exemplary configuration of a check node circuit according to a first embodiment.

Given below is the explanation of a first embodiment. In FIG. 8 is illustrated an exemplary configuration of a check node circuit according to the first embodiment. With reference to FIG. 8, the edges of the two-state trellis diagram illustrated in FIG. 6 are substituted with conducting wires, and switches $10_{11}$ to $10_{15}$, $10_{21}$ to $10_{24}$, $10_{31}$ to $10_{34}$, and $10_{41}$ to $10_{43}$ are arranged on the conducting wires. With that, a check node circuit 100 is configured. The following explanation is given as an example for a check node circuit that processes the probabilities received from five variable nodes. However, the variable nodes handled by the check node circuit can be greater or smaller in number than five.

Moreover, in the following explanation, regarding the switches $10_{11}$ to $10_{15}$, $10_{21}$ to $10_{24}$, $10_{31}$ to $10_{34}$, and $10_{41}$ to $10_{43}$; according to the function described later, the switches arranged on the conducting wires that connect nodes in the horizontal direction are expressed as $Q_y^x$ and the switches arranged on the conducting wires that connect nodes in an oblique direction are expressed as $P_y^x$. Herein, the subscript y represents an area in the two-state trellis diagram illustrated in FIG. 6. Regarding the superscript x, in the switches arranged on the conducting wires extending in the rightward direction (including the oblique directions) from the nodes in the state A (the nodes $a_0$ to $a_3$), the superscript x is written as "a". Similarly, in the switches arranged on the conducting wires extending in the rightward direction (including the oblique directions) from the nodes in the state B (the nodes $b_0$ to $b_4$), the superscript x is written as "b".

Thus, in the example illustrated in FIG. 8, the switches $10_{11}$ to $10_{15}$ to which the nodes $a_0$ to $a_5$ are sequentially connected are referred to as switches $Q_1^a$, $Q_2^a$, $Q_i^a$, $Q_3^a$, and $Q_4^a$. Similarly, the switches $10_{41}$ to $10_{43}$ to which the nodes $b_1$ to $b_4$ are sequentially connected are referred to as switches $Q_2^b$, $Q_i^b$, and $Q_3^b$. Moreover, in the rightward oblique direction from the nodes $a_0$ to $a_3$, the switches $10_{21}$ to $10_{24}$ arranged on the conducting wires connected to the nodes $b_1$ to $b_4$, respectively, are referred to as switches $P_1^a$, $P_2^a$, $P_i^a$, and $P_3^a$. Furthermore, in the rightward oblique direction from the nodes $b_1$ to $b_4$, the switches $10_{31}$ to $10_{34}$ arranged on the conducting wires connected to the nodes $a_2$ to $a_5$, respectively, are referred to as switches $P_2^b$, $P_i^b$, and $P_3^b$, and $P_4^b$.

Herein, it is desirable that the switches $Q_y^a$ and $Q_y^b$ perform exactly same operations. Similarly, it is desirable that the switches $P_y^a$ and $P_y^b$ perform exactly same operations. Moreover, it is desirable that the pair of switches $Q_y^a$ and $Q_y^b$ and the pair of switches $P_y^a$ and $P_y^b$ perform operations in a complementary manner. That is, when the switches $Q_y^a$ and $Q_y^b$ are in the open state, it is desirable that the switches $P_y^a$ and $P_y^b$ switch to the closed state. On the other hand, when the switches $Q_y^a$ and $Q_y^b$ are in the closed state, it is desirable that the switches $P_y^a$ and $P_y^b$ switch to the open state.

In the following explanation, in order to avoid complications, when the states A and B need not be particularly distinguished from each other, the switches $Q_y^a$ and $Q_y^b$ are collectively written as switches $Q_y$ and the switches $P_y^a$ and $P_y^b$ are collectively written as switches $P_y$.

The switches $Q_y$ and $P_y$ are configured to switch to the open state according to externally-set probabilities. Moreover, the switches $Q_y$ and $P_y$ perform operations in a complementary manner. Therefore, when the switches $Q_y$ switch to the open state at a probability $q_y$, the switches $P_y$ switch to the open state at a probability $(1-q_y)$.

With reference to FIG. 8, consider a case in which the switches $Q_1^a$, $Q_2^a$, $Q_i^a$, $Q_3^a$, and $Q_4^a$; the switches $P_1^a$, $P_2^a$, $P_i^a$, and $P_3^a$; the switches $P_2^b$, $P_i^b$, $P_3^b$, and $P_4^b$; and the switches $Q_2^b$, $Q_i^b$, and $Q_3^b$ are simultaneously operated to create a path between the nodes $a_0$ and $a_5$. For example, to the node $a_0$ is connected a power supply; to the node a is connected a current detector; and it is determined whether or not a current pathway is formed between the nodes $a_0$ and $a_5$.

Figure 9:
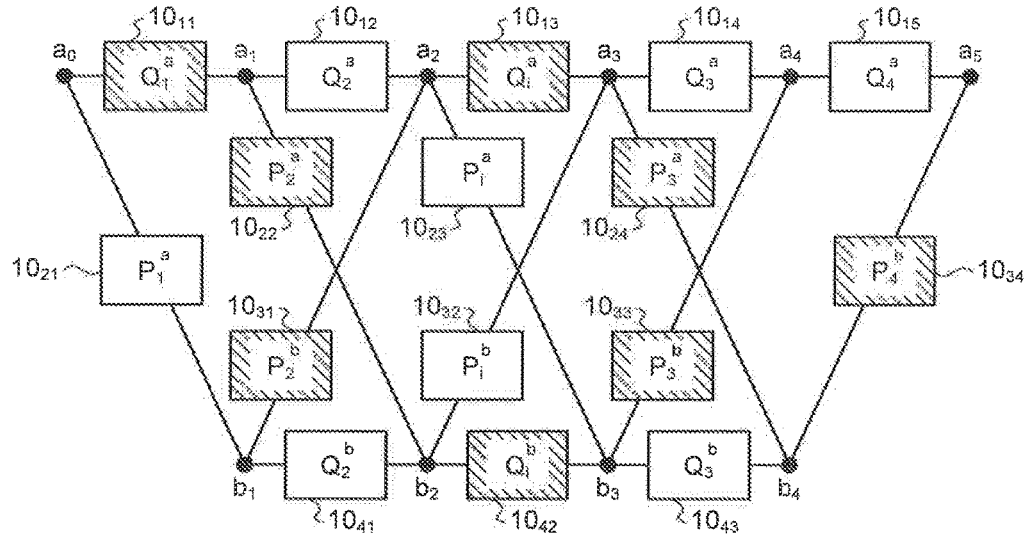
FIGS. 9 and 10 are diagrams illustrating exemplary states during the operations of switches in the check node circuit according to the first embodiment.
Figure 9:
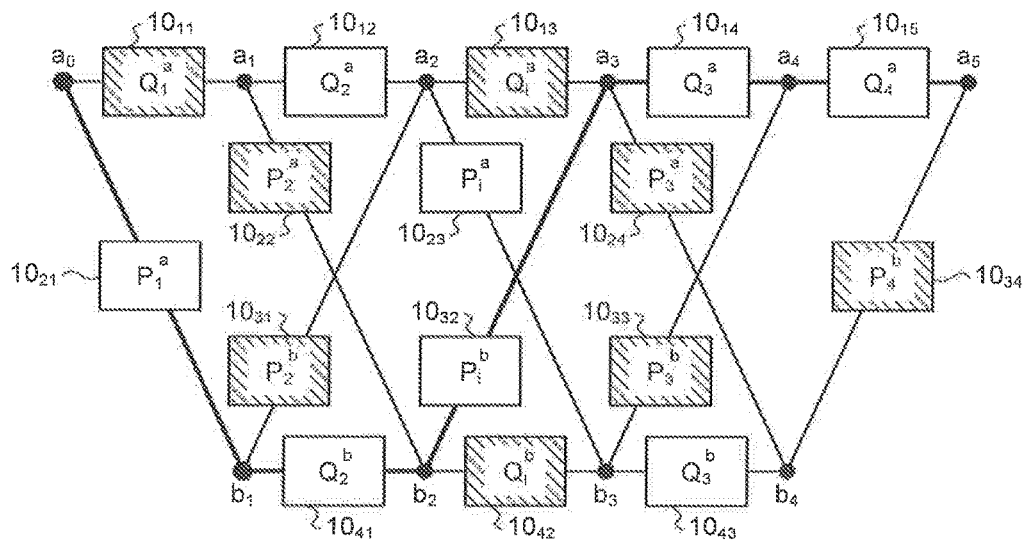

In FIG. 9 is illustrated an exemplary state during the operations of the switches. In (a) in FIG. 9, the switches illustrated with hatched lines represent the switches in the open state. Thus, in the example illustrated in (a) in FIG. 9, the switches $Q_1^a$, $Q_i^a$, $P_2^a$, $P_3^a$, $P_2^b$, $P_3^b$, $P_4^b$, and $Q_i^b$ are in the open state. The remaining switches are in the closed state.

In this case, as illustrated by heavy lines in (b) in FIG. 9, the following path is formed: the node $a_0 \rightarrow$ the switch $P_1^a \rightarrow$ the node $b_1 \rightarrow$ the switch $Q_2^b \rightarrow$ the node $b_2 \rightarrow$ the switch $P_i^b \rightarrow$ the node $a_3 \rightarrow$ the switch $Q_3^a \rightarrow$ the node $a_4 \rightarrow$ the switch $Q_4^a \rightarrow$ the node $a_5$. Thus, electrical current flows between the nodes $a_0$ and $a_5$. Other than this path, electrical current flows in no other path.

Herein, the probabilities at which the switches $Q_1$, $Q_2$, $Q_i$, $Q_3$, and $Q_4$ switch to the open state are assumed to be identical to the probabilities $q_1$, $q_2$, $q_i$, $q_3$, and $q_4$, respectively, at which the values of the variable nodes $c_1$, $c_2$, $c_i$, $c_3$, and $c_4$ are equal to "0". Consequently, the probability at which the current pathway illustrated with heavy lines in (b) in FIG. 9 is formed is provided by the probability $(p_1 q_2 p_i q_3 q_4)$.

Herein, the probability $p_k=1-q_k$ holds true and represents the probability at which the switch $P_k$ switches to the open state. This probability is equal to the probability at which the values of the variable nodes $c_1$, $c_2$, $c_i$, $c_3$, and $c_4$ are equal to $(c_1, c_2, c_i, c_3, c_4)=(10100)$. In this way, the probability at which a particular path from the starting node $a_0$ to the end node $a_5$ is formed is equal to the probability at which a particular combination of the values of the variable nodes $\{c_1, c_2, c_i, c_3, c_4\}$ (in the example given above, "10100") is achieved. This particular combination satisfies the parity condition without fail. That is because of the following reason. In order to start from the node $a_0$ and reach the node $a_5$, the switches $P_y$ need to be passed for an even number of times. However, the probability at which the switches $P_y$ switch to the open state is equal to the probability $p_y$, that is, equal to the probability at which $c_y=1$ holds true.

Figure 10:
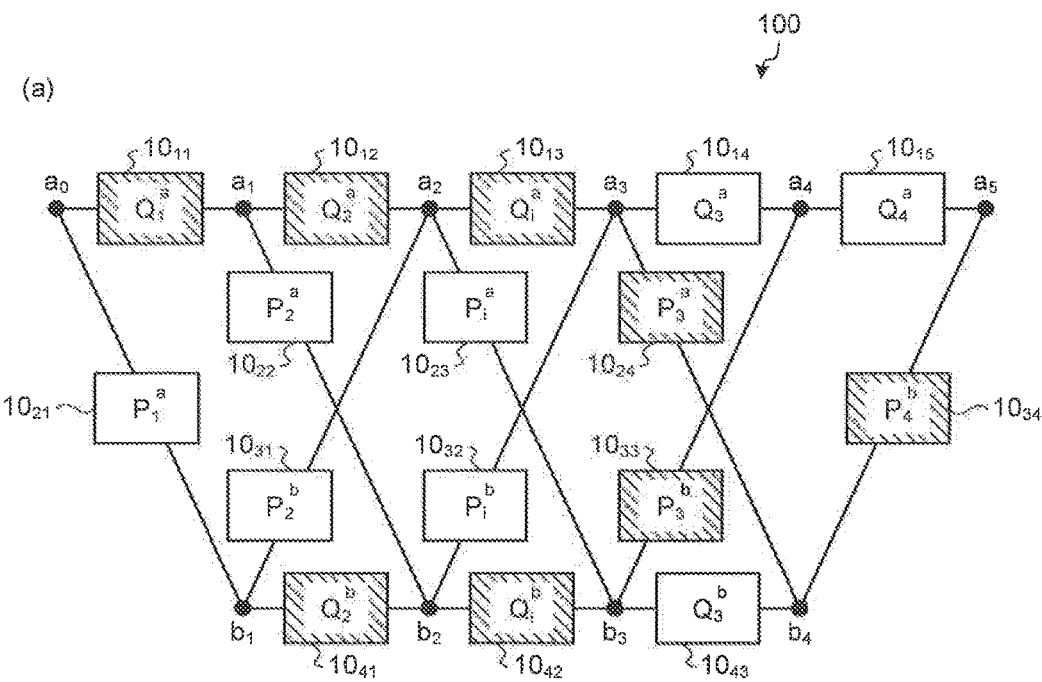
Figure 10:
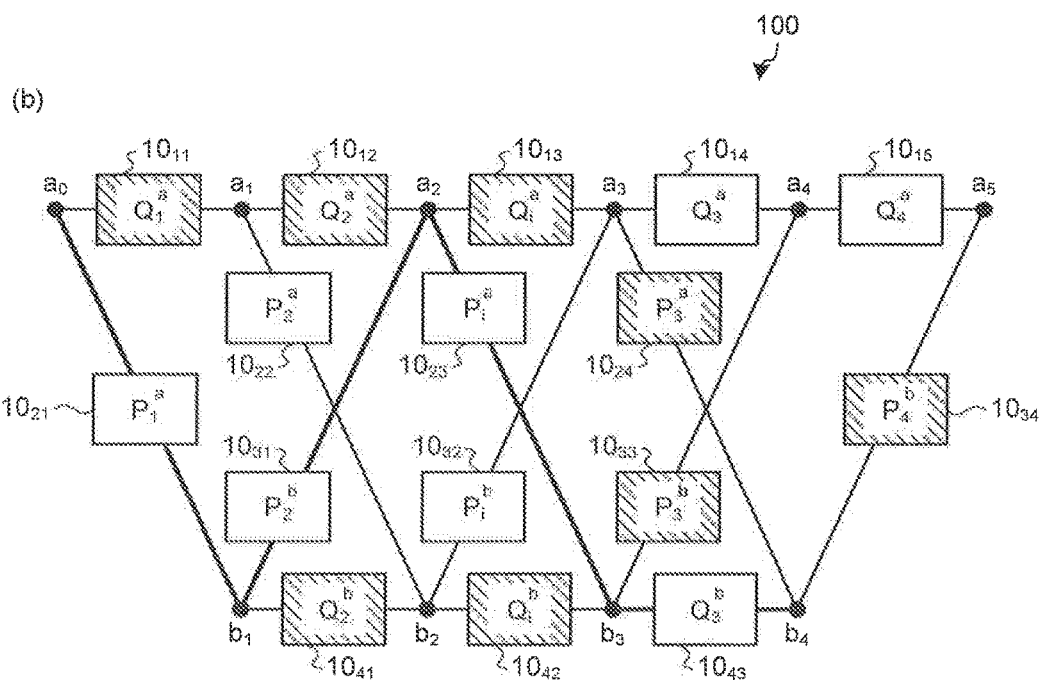

Meanwhile, among the paths starting from the node $a_0$, there are paths that cannot reach the node $a_5$. Regarding that, the explanation is given with reference to FIG. 10. In (a) in FIG. 10, the switches $Q_1^a$, $Q_2^a$, $Q_i^a$, $Q_2^b$, $Q_i^b$, $P_3^a$, $P_3^b$, $P_4^b$ are in the open state. The remaining switches are in the closed state. In that case, the path that is formed is illustrated in (b) in FIG. 10. As illustrated in (b) in FIG. 10, in this example, the path starting from the node $a_0$ reaches the node $b_4$. However, since the switch $P_4^b$ is in the open state, the path cannot reach the node $a_5$. The probability at which the path illustrated in (b) in FIG. 10 is formed is provided by a probability $(p_1 p_2 p_i q_3 a_4)$. This probability is equal to the probability at which the values $(c_1, c_2, c_i, c_3, c_4)$ of the variable nodes $\{c_1, c_2, c_i, c_3, c_4\}$ are equal to "11100".

Thus, it can be understood that the probability (even 1, 2, i, 3, 4) at which the set $\{c_1, c_2, c_i, c_3, c_4\}$ of values of the variable nodes $\{c_1, C_2, c_i, c_3, c_4\}$ satisfies the parity condition is equal to the probability at which a path starting from the starting node $a_0$ to the end node $a_5$ is formed with reference to FIG. 8. Moreover, it can be understood that the probability (odd 1, 2, i, 3, 4) for parity violation is equal to the probability at which the path runs into a dead end at the node $a_4$ or the node $b_4$.

In that regard, consider a case in which the check node circuit 100 illustrated in FIG. 8 is operated for a number of times and, every time the check node circuit 100 is operated, the conduction between the nodes $a_0$ to $a_5$ is checked. Since the switches $Q_y$ and $P_y$ that are installed in the check node circuit 100 perform a probability-based switching operation, the states of the switches $Q_y$ and $P_y$ differ in every instance of operating the check node circuit 100. For that reason, the conduction between the nodes $a_0$ to $a_5$ also differs in every instance of operating the check node circuit 100. However, the probability of switching of the switches $Q_y$ and $P_y$ is constant. Hence, if switching of the switches $Q_y$ and $P_y$ in the check node circuit 100 is performed in a repeated manner, and if statistical processing is performed with respect to the conduction determination results; conduction is achieved at the probability for satisfying the parity condition but conduction is blocked at the probability for parity violation.

For example, consider a case in which the check node circuit 100 is made to perform a switching operation for 20 times with constant switching probabilities of the switches $Q_y$ and $P_y$, and conduction is achieved for eight times. In that case, the probability of satisfying the parity condition is 40%, and the probability of parity violation is 60%. Herein, since the probability at which the variable node $c_i$ is currently equal to "0" is known, it is possible to obtain the probability at which $c_i$=0 should hold true. That is equivalent to a message from the check node $f_j$ to the variable node $c_i$, and the check node $f_j$ transfers the result to the variable node $c_i$. Then, the variable node $c_i$ tallies the results received from the other check nodes, and updates the values of the probabilities $q_i$ and $p_i$.

In this way, in the first embodiment, the topology of the circuit that performs the check node processing during the decoding operation of an LDPC code is made compatible to a two-state trellis diagram that represents the algorithm of the check node processing. Then, the check node circuit 100 is configured by disposing, for each edge in the two-state trellis diagram, switches that perform a switching operation according to the set probability.

Meanwhile, in the explanation given above, although the same check node circuit 100 is operated in a repeated manner, that is not the only possible case. Alternatively, for example, a number of check node circuits 100 having an identical configuration can be installed, and the conduction probabilities can be obtained in parallel.

As described above, if the conduction is checked by repeatedly operating the check node circuit 100, which is illustrated in FIG. 8 and which includes the switches $Q_y$ and $P_y$ operating according to probabilities, or by installing a plurality of check node circuits 100 and operating them in parallel; it becomes possible to perform the check node processing with respect to the LDPC code.

Figure 11:
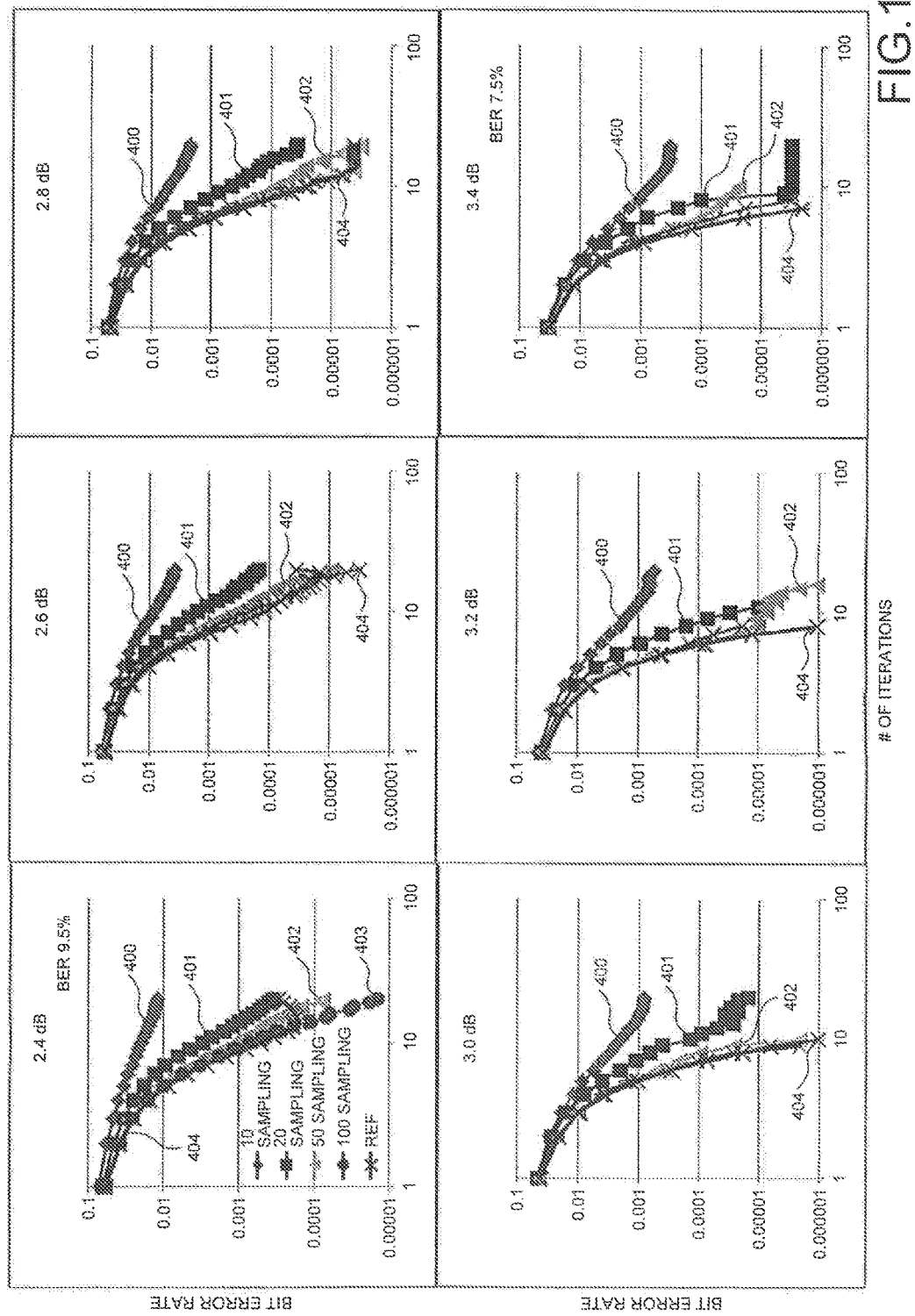
FIG. 11 is a diagram illustrating results of performing error correction of 981 bits using a 981×500 check matrix.

In the following explanation, repeating the processing according to stochastic operations or performing a plurality of calculations in parallel according to stochastic operations is called sampling. The sampling count is equivalent to the accuracy of the probability value during calculations for decoding the LDPC code. In FIG. 11 are illustrated results of performing error correction of 981 bits using a 981×500 check matrix H. In each graph, the horizontal axis represents the repetition count of the decoding calculations, while the vertical axis represents the rate of error bits remaining in the code. In the code, errors have occurred due to AWGN (which stands for Additive White Gaussian Noise), and error correction capacity is verified for the SN ratios of 2.4 dB, 2.6 dB, 2.8 dB, 3.0 dB, 3.2 dB, and 3.4 dB with the sampling counts equal to 10 (a characteristic line 400), 20 (a characteristic line 401), 50 (a characteristic line 402), and 100 (a characteristic line 403). Moreover, a characteristic line 404 illustrated in FIG. 11 indicates the error correction result according to the normal LDPC decoding method, that is, according to the real number calculation.

As can be understood from the graphs illustrated in FIG. 11, when the sampling count is equal to 10, the error correction capacity is low. However, as the sampling count goes on increasing, the error correction capacity improves. Particularly, if the sampling count is 20 or more, it can be understood that the error correction capacity that compares favorably to the real number calculation can be achieved. In this way, if a simple circuit that operates according to probabilities is used in the check node processing with respect to the LDPC code, it becomes possible to perform error correction.

Meanwhile, as already described, it is desirable that the switches $Q_y^a$ and $Q_y^b$ perform exactly same operations, and the switches $P_y^a$ and $P_y^b$ perform exactly same operations. In that case, it is desirable that the pair of switches $Q_y^a$ and $Q_y^b$ and the pair of switches $P_y^a$ and $P_y^b$ perform operations in a complementary manner. Hence, as explained above, when both the switches $Q_y^a$ and $Q_y^b$ are in the open state, both the switches $P_y^a$ and $P_y^b$ switch to the closed state. On the other hand, when both the switches $Q_y^a$ and $Q_y^b$ are in the closed state, both the switches $P_y^a$ and $P_y^b$ switch to the open state. That is because, since a particular variable node $c_y$ can take the value of either "1" or "0" in an exclusive manner, the switching operations are also provided with exclusiveness.

Meanwhile, if the exclusiveness among the switches $Q_y$ and the switches $P_y$ is ignored, there is a possibility that a plurality of paths connecting the nodes $a_0$ and $a_5$ are formed at the same time. In that case, the sum of probabilities in Equation (7) given above does not hold true anymore. However, that error is equal to about the probability at which two or more paths are formed at the same time, and can be considered to be an extremely small error. The essence of error correction using an LDPC code is stochastic inference, which has the merit of being tolerable to a certain amount of ambiguity.

In the case of the embodiments, the probability at which a plurality of paths is formed at the same time is smaller as compared to the value of each term in Equation (7). Thus, even if the operation such as "when both the switches $Q_y^a$ and $Q_y^b$ are in the open state, both the switches $P_y^a$ and $P_y^b$ switch to the closed state" is not performed, it becomes possible to perform error correction.

In this way, in the first embodiment, the topology of the circuit for performing the check node processing during the decoding operation of the LDPC code is made compatible to a two-state trellis diagram that represents the algorithm of the check node processing. Then, the check node circuit 100 is configured by installing, for each edge in the two-state trellis diagram, switches that perform a switching operation according to the set probability. For that reason, the check node processing during LDPC decoding can be implemented with a simple configuration.

Second Embodiment

Figure 12:
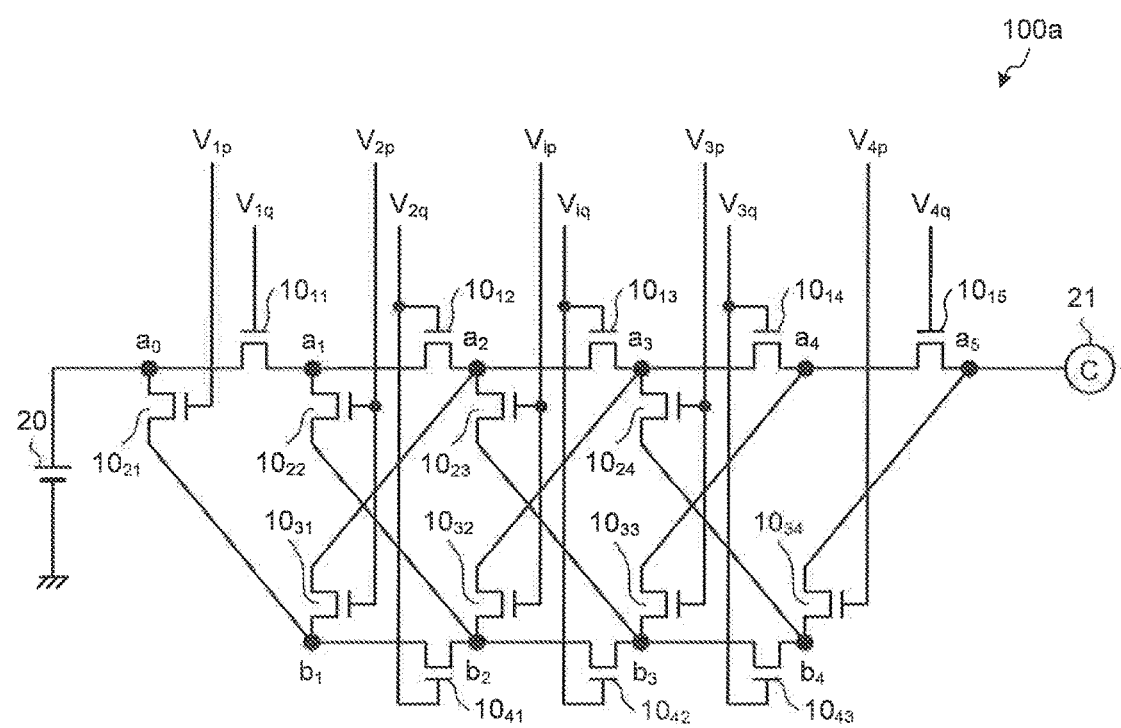
FIG. 12 is a circuit diagram illustrating an example of a check node circuit according to a second embodiment.

Given below is the explanation of a second embodiment. In the second embodiment, the check node circuit 100 illustrated in FIG. 8 is configured using an MOS transistor (MOS stands for Metal-Oxide Semiconductor). In FIG. 12 is illustrated an example of a check node circuit 100*a* according to the second embodiment. Meanwhile, in FIG. 12 as well as in the similar drawings referred hereinafter, the common portion with FIG. 8 is referred to by the same reference numerals, and the detailed explanation is not repeated.

With reference to FIG. 12, the switch units 10$_{11}$ to 10$_{15}$ and 10$_{41}$ to 10$_{43}$ that correspond to the switches $Q_y$ as well as the switch units $10_{21}$ to $10_{24}$ and $10_{31}$ to $10_{34}$ that correspond to the switches $P_y$ are configured using NMOS transistors (NMOS stands N-channel Metal Oxide Semiconductor) or PMOS transistors (PMOS stands for P-channel Metal Oxide Semiconductor). Although the switch units can be configured using either NMOS transistors or PMOS transistors, herein it is assumed that NMOS transistors are used.

Regarding each of the switch units $10_{11}$ to $10_{15}$, $10_{21}$ to $10_{24}$, $10_{31}$ to $10_{34}$, and $10_{41}$ to $10_{43}$; the source is connected to the nodes $a_0$ to $a_5$ and the drain is connected to the nodes $b_1$ to $b_4$, and switching between the source and the drain is controlled by a signal V input to the gate. In the example illustrated in FIG. 12, to the switch units $10_{12}$ and $10_{41}$ is input a signal $V_{2q}$ of the probability $q_2$; and to the switch units $10_{22}$ and $10_{31}$ is input a signal $V_{2p}$ of the probability $p_2=1-q_2$. Herein, a signal $V_j$ of a probability $q_j$ represents a digital signal that takes the value of either "1" or "0" according to the probability $q_j$. Such a signal can be generated, for example, based on random numbers.

In an identical manner, to the switch units $10_{13}$ and $10_{42}$ is input a signal $V_{iq}$ of the probability $q_i$; and to the switch units $10_{23}$ and $10_{32}$ is input a signal $V_{ip}$ of the probability $p_i=1-q_i$. Moreover, to the switch units $10_{14}$ and $10_{43}$ is input a signal $V_{3q}$ of the probability $q_3$; and to the switch units $10_{24}$ and $10_{33}$ is input a signal $V_{3p}$ of the probability $p_3=1-q_3$. Meanwhile, to the switch unit $10_{11}$ is input a signal $V_{1q}$ of the probability $q_1$; and to the switch unit $10_{21}$ is input a signal $V_{1p}$ of the probability $p_1=1-q_1$. In an identical manner, to the switch unit $10_{15}$ is input a signal $V_{4q}$ of the probability $q_4$; and to the switch unit $10_{34}$ is input a signal $V_{4p}$ of the probability $p_4$.

In the check node circuit $100a$, for example, a current source 20 is connected to the starting node $a_0$, and a current detector 21 is connected to the end node $a_5$. Based on the detection result obtained by the current detector 21 according to the switching of the switch units $10_{11}$ to $10_{15}$, $10_{21}$ to $10_{24}$, $10_{31}$ to $10_{34}$, and $10_{41}$ to $10_{43}$; it becomes possible to determine whether or not a path is formed between the nodes $a_0$ to $a_5$. Regarding the determination result, either it is determined that a path is formed with the probability of satisfying the parity condition, or it is determined that a path is not formed with the probability of violating the parity condition.

Figure 13:
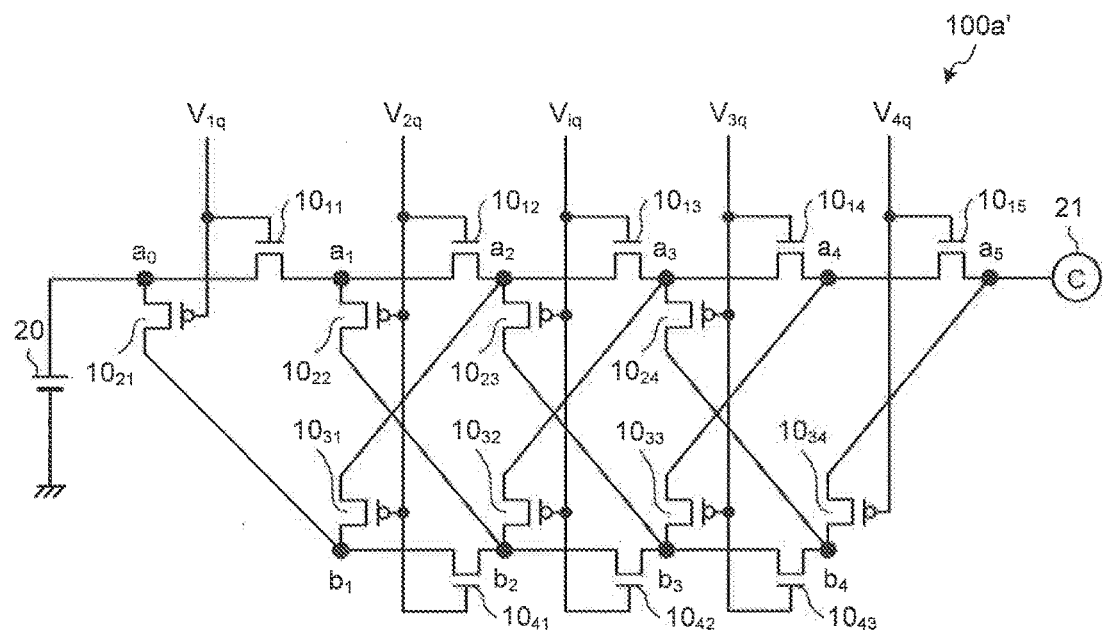
FIGS. 13 and 14 are diagrams illustrating examples in which the check node circuit according to the second embodiment is configured with NMOS transistors and PMOS transistors.

In the check node circuit $100a$ illustrated in FIG. 12, the switches $Q_y$ and $P_y$, which are operated in a complementary manner with respect to probabilities, can be configured using two different types of conductivity-type transistors. In the following explanation, the two different types of conductivity-type transistors are assumed to be NMOS transistors and PMOS transistor-transistors. In FIG. 13 is illustrated an example of a check node circuit $100a'$ in which the switches $Q_y$, that is, the switch units $10_{11}$ to $10_{15}$ and $10_{41}$ to $10_{43}$ that are arranged on the conducting wires in the horizontal direction of the nodes in the two-state trellis diagram are configured with NMOS, transistors; while the switches $P_y$, that is, the switch units $10_{21}$ to $10_{24}$ and $10_{31}$ to $10_{34}$ that are arranged on the conducting wires in an oblique direction are configured with PMOS transistors.

Figure 14:
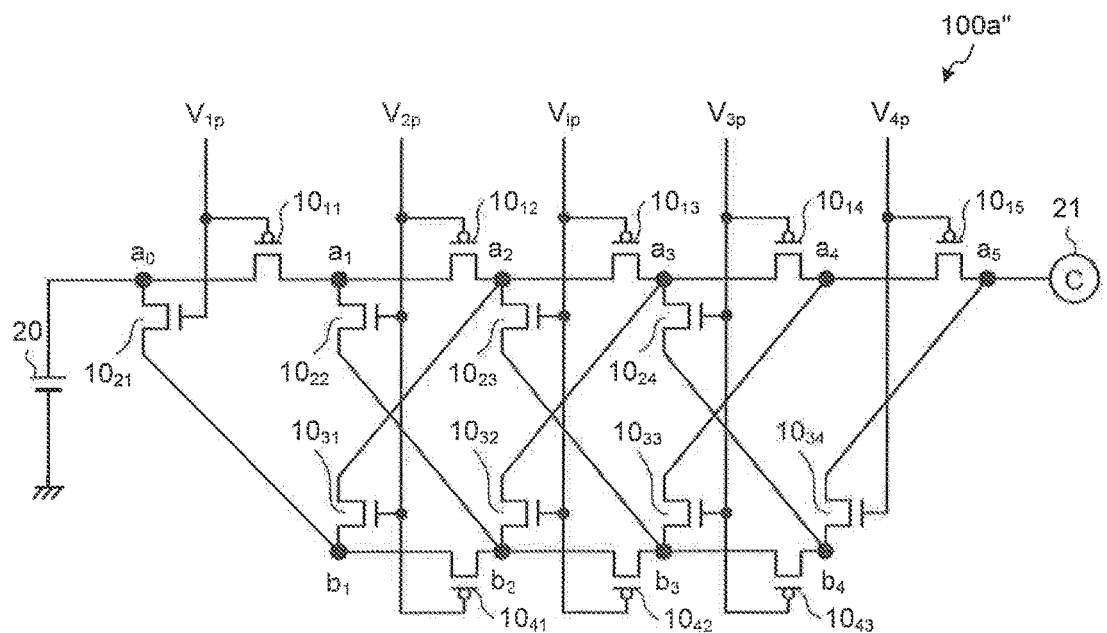

In contrast, in FIG. 14 is illustrated an example of a check node circuit $100a''$ in which the switches $Q_y$, that is, the switch units $10_{11}$ to $10_{15}$ and $10_{41}$ to $10_{43}$ that are arranged on the conducting wires in the horizontal direction in the two-state trellis diagram are configured with PMOS transistors; while the switches $P_y$, that is, the switch units $10_{21}$ to $10_{24}$ and $10_{31}$ to $10_{34}$ that are arranged on the conducting wires in an oblique direction are configured with NMOS transistors.

An NMOS transistor and a PMOS transistor perform complementary operations with respect to the same gate input. Hence, to the pair of switches $Q_y$ and $P_y$ that desirably perform complementary operations; for example, a signal $V_{yq}$ can be commonly input so that a high state is achieved at the probability $q_y$ and a low state is achieved at the probability $p_y=1-q_y$. Of course, to the pair of switches $Q_y$ and $P_y$, a signal $V_{yp}$ can also be commonly input so that a high state is achieved at the probability $p_y$ and a low state is achieved at the probability $q_y=1-p_y$.

In the example illustrated in FIG. 13, the signal $V_{2q}$ of the probability $q_2$ is commonly input to the gates of the switch units $10_{12}$, $10_{22}$, $10_{31}$, and $10_{41}$. In an identical manner, the signal $V_{iq}$ of the probability $q_i$ is commonly input to the gates of the switch units $10_{13}$, $10_{23}$, $10_{32}$, and $10_{42}$. Moreover, the signal $V_{3q}$ of the probability $q_3$ is commonly input to the gates of the switch units $10_{14}$, $10_{24}$, $10_{33}$, and $10_{43}$. Furthermore, the signal $V_{1q}$ of the probability $q_1$ is commonly input to the gates of the switch units $10_{11}$ and $10_{21}$; and the signal $V4_q$ of the probability $q_4$ is commonly input to the gates of the switch units $10_{15}$ and $10_{34}$.

In the check node circuit $100a''$, which is illustrated in FIG. 14 and in which the NMOS transistors and the PMOS transistors are reversed as compared to the check node circuit $100a'$ illustrated in FIG. 13, the signals $V_3$, $V_2$, $V_3$, $V_4$ and $V_i$ are respectively treated as signals $V_{1p}$, $V_{2p}$, $V_{3p}$, $V_{4p}$ and $V_{ip}$ of the probabilities $p_1$, $p_2$, $p_3$, $p_4$ and $p_i$, respectively, contrary to the case illustrated in FIG. 13.

In this way, in the second embodiment, the switches that are arranged on the edges of a two-state trellis diagram, which represents the check node processing during the decoding operation of an LDPC code, and that operate in a stochastic manner are configured using MOS transistors. For that reason, the check node processing during LDPC decoding can be implemented with a simple configuration.

Third Embodiment

Figure 15:
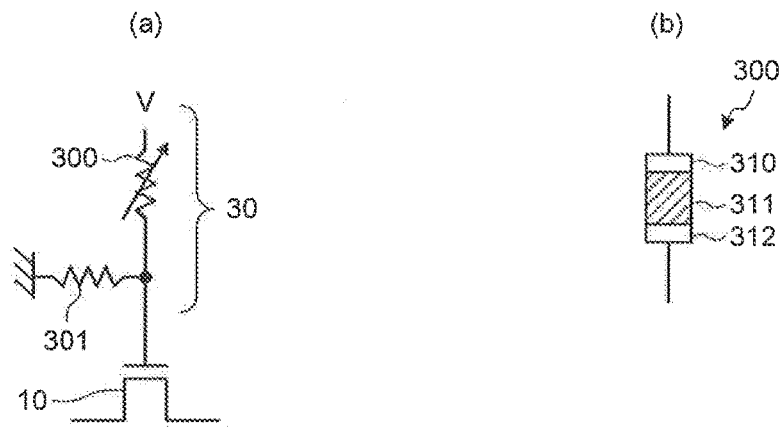
FIG. 15 is a diagram illustrating an exemplary configuration of a probability signal generator according to a third embodiment.

Given below is the explanation of a third embodiment. In the third embodiment, the signals of the probabilities $q_y$ and $p_y$ are generated using resistance switch elements having two or more resistive states. In FIG. 15 is illustrated an exemplary configuration of a probability signal generator 30 in which a resistance switch element 300 is used. With reference to (a) in FIG. 15, the resistance switch element 300 is controlled to have the resistance value either in a high-resistance state or in a low-resistance state according to the setting done from outside. In the resistance switch element 300, one end is supplied with the signal V of a fixed voltage; and the other end is connected to the gate of a switch unit 10. Moreover, the resistance switch element 300 is, for example, grounded via a resistance 301 having a resistance value $R_0$.

Figure 16:
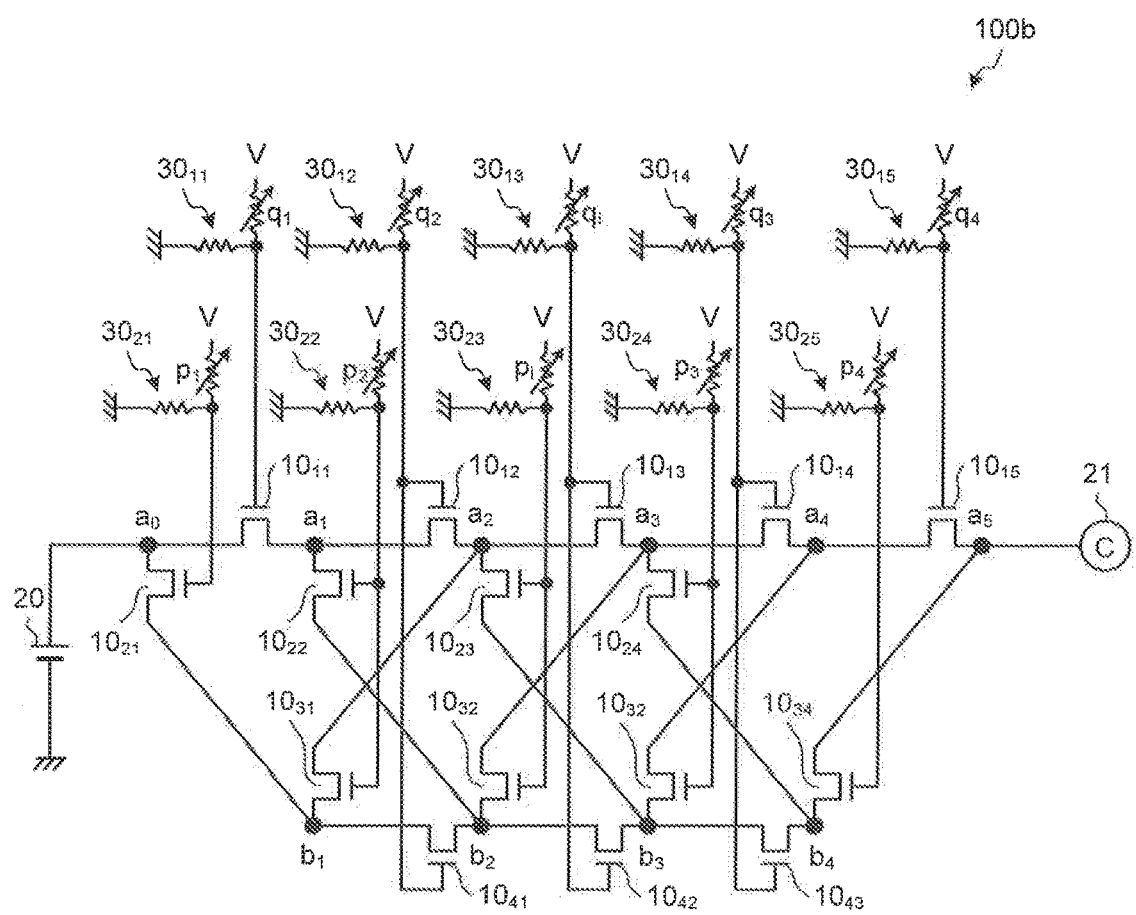
FIG. 16 is a diagram illustrating an exemplary configuration of a check node circuit in which the probability signal generators according to the third embodiment are used.

In FIG. 16 is illustrated an exemplary configuration of a check node circuit $100b$ in which the probability signal generators 30 are used. The check node circuit $100b$ corresponds to the check node circuit $100a$ explained with reference to FIG. 12. In the check node circuit $100b$, to the switch units. $10_{12}$ and $10_{41}$ is commonly connected a probability signal generator $30_{12}$; and to the switch units $10_{22}$ and $10_{31}$ is commonly connected a probability signal generator $30_{22}$. In an identical manner, to the switch units $10_{13}$ and $10_{42}$ is commonly connected a probability signal generator $30_{13}$; and to the switch units $10_{23}$ and $10_{32}$ is commonly connected a probability signal generator $30_{23}$. Moreover, to the switch units $10_{14}$ and $10_{43}$ is commonly connected a probability signal generator $30_{14}$; and to the switch units $10_{24}$ and $10_{33}$ is commonly connected a probability signal generator $30_{24}$. Furthermore, to the switch unit $10_{11}$ is connected a probability signal generator $30_{11}$; and to the switch unit $10_{21}$ is connected a probability signal generator $30_{21}$. In an identical manner, to the switch unit $10_{15}$ is connected a probability signal generator $30_{15}$; and to the switch unit $10_{34}$ is connected a probability signal generator $30_{25}$.

Given below is the detailed explanation of the operations performed by the resistance switch element 300. Herein, it is assumed that a resistance value $R_{high}$ represents the resistance value in the high-resistance state of the resistance switch element 300; a resistance value $R_{low}$ represents the resistance value in the low-resistance state of the resistance switch element 300; and $R_{high} \gg R_0 \gg R_{low}$ holds true. In the low-resistance state of the resistance switch element 300, $R_0 \gg R_{low}$ holds true. Hence, the voltage V that is input from one end of the resistance switch element 300 gets applied without substantial modification to the gate of the switch unit 10. If the switch unit 10 is an NMOS transistor, it switches to the closed state. On the other hand, if the switch unit 10 is a PMOS transistor, it switches to the open state. Meanwhile, in the high-resistance state of the resistance switch element 300, $R_0 \ll R_{high}$ holds true. Hence, the voltage V that is input from one end of the resistance switch element 300 becomes substantially equal to 0 V. In that case, if the switch unit 10 is an NMOS transistor, it switches to the open state. On the other hand, if the switch unit 10 is a PMOS transistor, it switches to the closed state.

As far as the resistance switch element 300 is concerned, a transition metal oxide such as $TiO_x$, $TaO_x$, $HfO_x$, or $WO_x$ is known; or a muitielemental oxide such as $SrTiO_3$ or $Pr_{0.7}Ca_{0.3}MnO_3$ is known; or a capacitor element is known in which a thin film of halogen, such as $CaF_2$ or $BaF_2$, is sandwiched between metal electrodes. In (b) in FIG. 15 is schematically illustrated a structure of the resistance switch element 300. Schematically, the structure of the resistance switch element 300 is such that an insulator thin film 311 is sandwiched between an upper electrode 310 and a lower electrode 312. The insulator thin film 311 has the film thickness of few nanometers to several tens of nanometers. However, that is not the only possible case. That is, the insulator thin film 311 can have a smaller film thickness or a greater film thickness.

The resistance switch element 300 has the characteristic that the deficient oxygen or the deficient halogen that is present inside moves due to voltage, and there is an exponential change in the resistance to the application of voltage. For example, in the case in which the insulator thin film 311 in the resistance switch element 300 is made of a metal oxide, if a positive voltage is applied to the upper electrode 310, the deficient oxygen present inside moves away from the boundary face of the upper electrode 310 thereby leading to the transition from the low-resistance state to the high-resistance state. On the other hand, if a negative voltage is applied to the upper electrode 310, the deficient oxygen gathers at the boundary face of the upper electrode 310 thereby leading to the transition from the high-resistance state to the low-resistance state. This phenomenon is called a bipolar resistance switching phenomenon.

Figure 17:
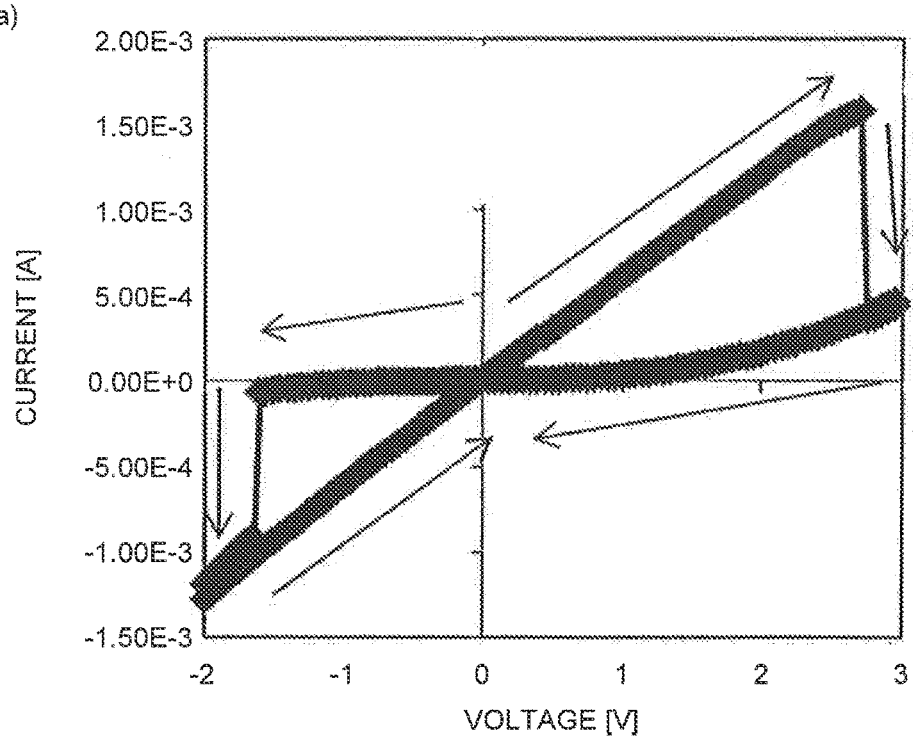
FIG. 17 is a diagram illustrating an example of the current-voltage characteristic of the Dipolar resistance switching phenomenon occurring due to $TaO_x$.
Figure 17:
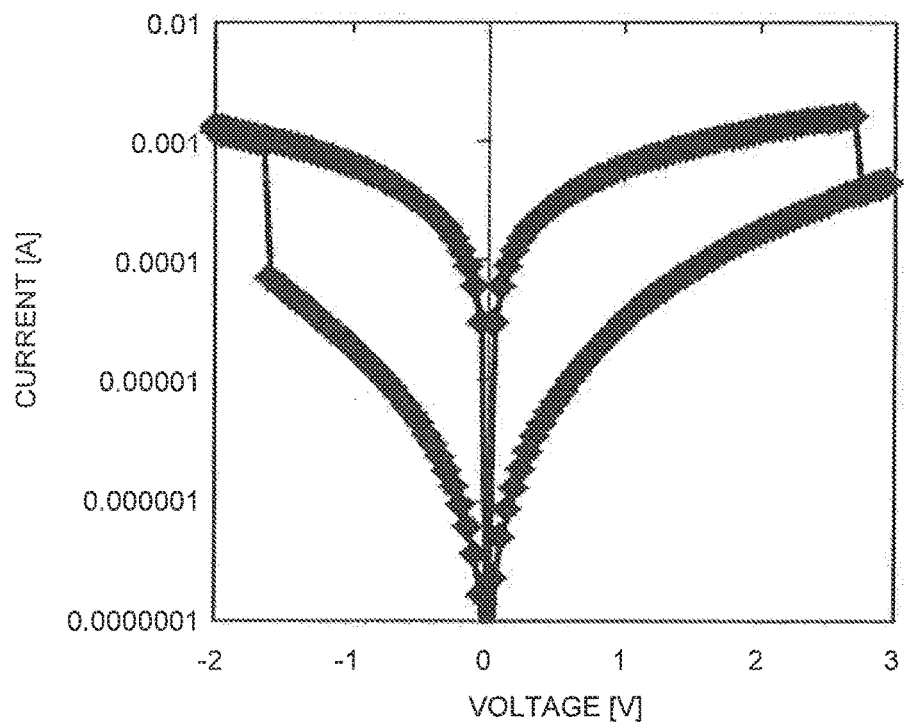

In FIG. 17 is illustrated an example of the current-voltage characteristic of the bipolar resistance switching phenomenon occurring due to $TaO_x$. In (a) and (b) in FIG. 17, the left end indicates the transition from the high-resistance state to the low-resistance state; and the right end indicates the transition from the low-resistance state to the high-resistance state. In the bipolar resistance switching phenomenon attributed to the deficient oxygen, it is possible to achieve a resistance ratio of 100 times or more between the high-resistance state and the low-resistance state. Thus, the abovementioned condition of $R_{high} \gg R_0 \gg R_{low}$ can be satisfied.

Meanwhile, as the resistance switch element 300, it is also possible to use a capacitor element, which has a structure in which a sulfide or a selenide such as silver sulfide, copper sulfide, germanium sulfide, or germanium selenide; or an amorphous semiconductor such as amorphous silicon; or a metallic ion conductor of an oxidative product such as $SiO_2$ or $TaO_x$ is sandwiched between the upper electrode 310, which is made of Ag, Cu, or Ni that is easily ionizable, and the lower electrode 312 made or Pt, Ta, W, or Ir that is difficult to ionize. In the case of a capacitor element, the thickness of the metallic ion conductor is, for example, between few nanometers to several tens of nanometers. However, the thickness can be greater or smaller than that.

Regarding the capacitor-type resistance switch element 300, in the structure illustrated in (b) in FIG. 15, a metallic ion conductor is used in place of the insulator thin film 311. Then, the ions of the upper electrode 310 enter the metal ion conductor. Due to the application of voltage, the metallic ions move thereby leading to an exponential change in the resistance value. For example, when a positive voltage is applied to the upper electrode 310 that is made of an easily-ionizable metal; the metallic ions flow from the upper electrode 310 to the metallic ion conductor thereby leading to the formation of a conduction path, and the resistance switch element 300 switches from the high-resistance state to the low-resistance state. On the other hand, when a negative voltage is applied to the upper electrode 310; the metallic ions that were forming the conduction path return to the upper electrode 310. Therefore, the resistance switch element 300 switches from the low-resistance state to the high-resistance state. In the resistance switch element 300 in which a capacitor element is used, it is possible to achieve a resistance ratio of 1000 times or more between the high-resistance state and the low-resistance state. Thus, the abovementioned condition of $R_{high} \gg R_0 \gg R_{low}$ can be satisfied.

The common aspect in such resistance switch elements 300 is that a deficiency or ions move inside the insulator and the resistance undergoes transition. As compared to electrons, a deficiency or ions move in an extremely large and hopping manner in the grid of the insulator. That collective behavior becomes a stochastic behavior. For that reason, even in the case in which the voltage is repeatedly applied under the same condition to the resistance switch element 300 in the high-resistance state, the transition to the low-resistance state does not occur except in a stochastic manner.

Figure 18:
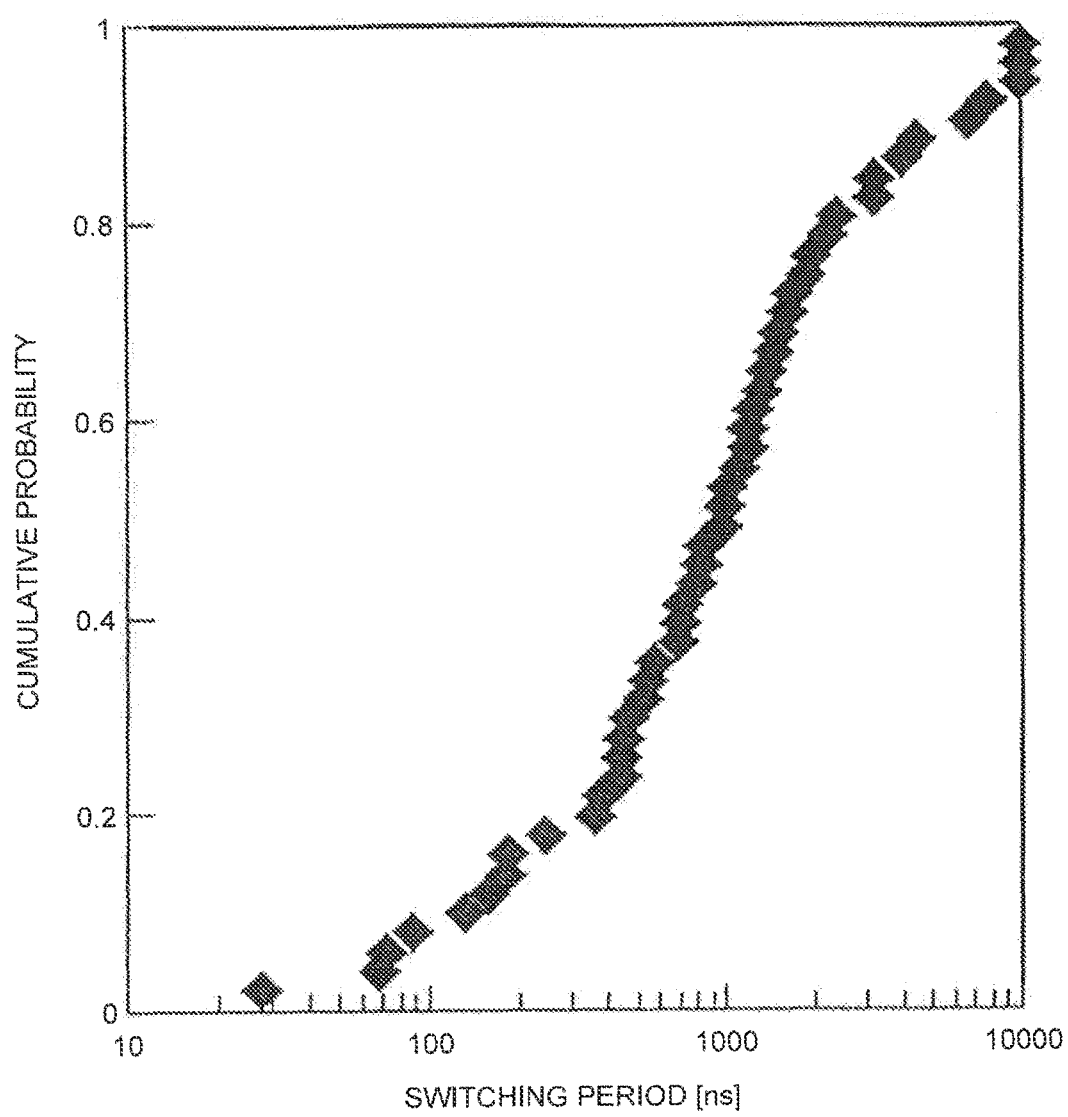
FIG. 18 is a diagram illustrating an exemplary relationship between the switching period and the cumulative probability of a resistance switch element in which $TaO_x$ is used.

In FIG. 18 is illustrated an exemplary relationship between the switching period and the cumulative probability of the resistance switch element 300 in which $TaO_x$ is used. That is, in FIG. 18 is illustrated a cumulative probability distribution of the period of time (the switching period) taken in the resistance switch element 300, in which $TaO_x$ is used, since the application of a fixed voltage in the high-resistance state up to transition to the low-resistance state. As can be understood from FIG. 18, the switching period is distributed across about triple digits, and it is indicated that the transition itself is stochastic. If the state of the resistance switch element 300 is to be switched at the rate of 20%, it can be understood from FIG. 18 that the voltage can be applied for 400 nanoseconds. That is, in FIG. 18, it takes 400 nanoseconds for the cumulative probability to reach 0.2.

In this way, using the resistance switch element 300 in which the cumulative probability changes according to the switching period, the probability signal generator 30 as illustrated in (a) in FIG. 15 is configured. To both ends of the resistance switch element 300, a voltage is applied only for a period of time in which a desired probability is achieved, and the resistance switch element 300 is set to a low resistance at a desired probability. Then, to one end of the resistance switch element 300 (to the end not connected to the switch unit 10), a gate signal for the switch unit 10 is input. As a result, the switch unit 10 can be switched to the open state at a desired probability.

As a result of using this type of resistance switch element 300, as illustrated in FIG. 16, the check node processing during LDPC decoding can be implemented with a simple configuration.

With reference to FIG. 16, to each of the probability signal generators $30_{11}$ to $30_{15}$ and $30_{21}$ to $30_{25}$, the signal V of a fixed voltage is input; and each resistance switch element 300 is controlled according to the probabilities $q_1$, $q_2$, $q_i$, $q_3$, and $q_4$ as well as according to the probabilities $p_1$, $p_2$, $p_i$, $p_3$, and $p_4$.

Figure 19:
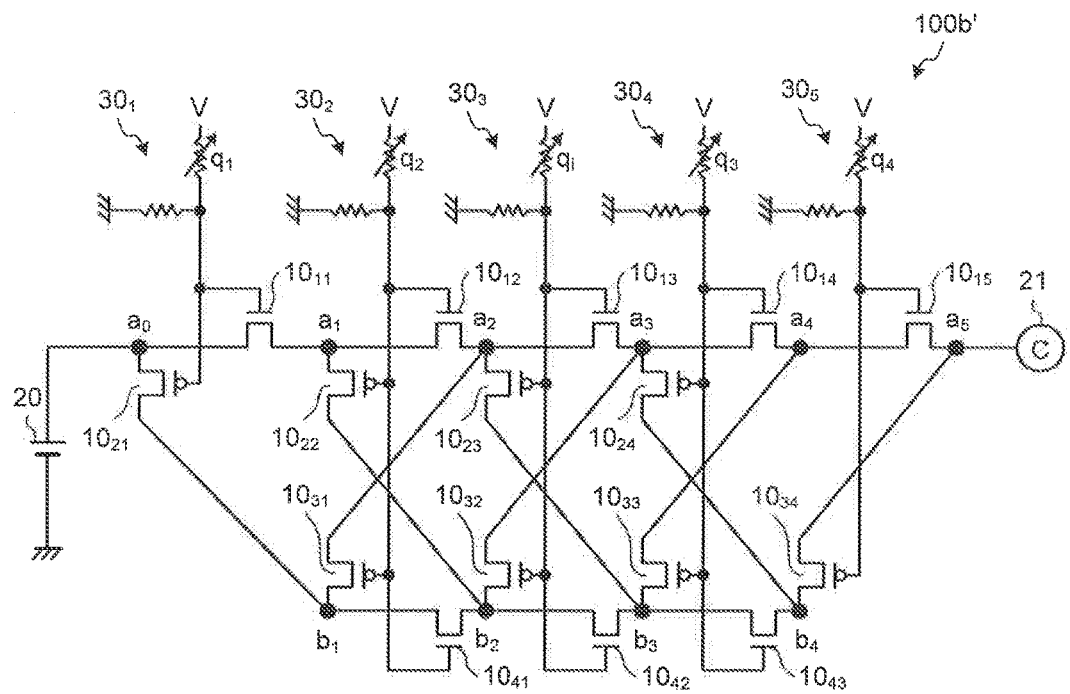
FIGS. 19 and 20 are diagrams illustrating examples in which the check node circuit according to the third embodiment is configured with NMOS transistors and PMOS transistors.
Figure 20:
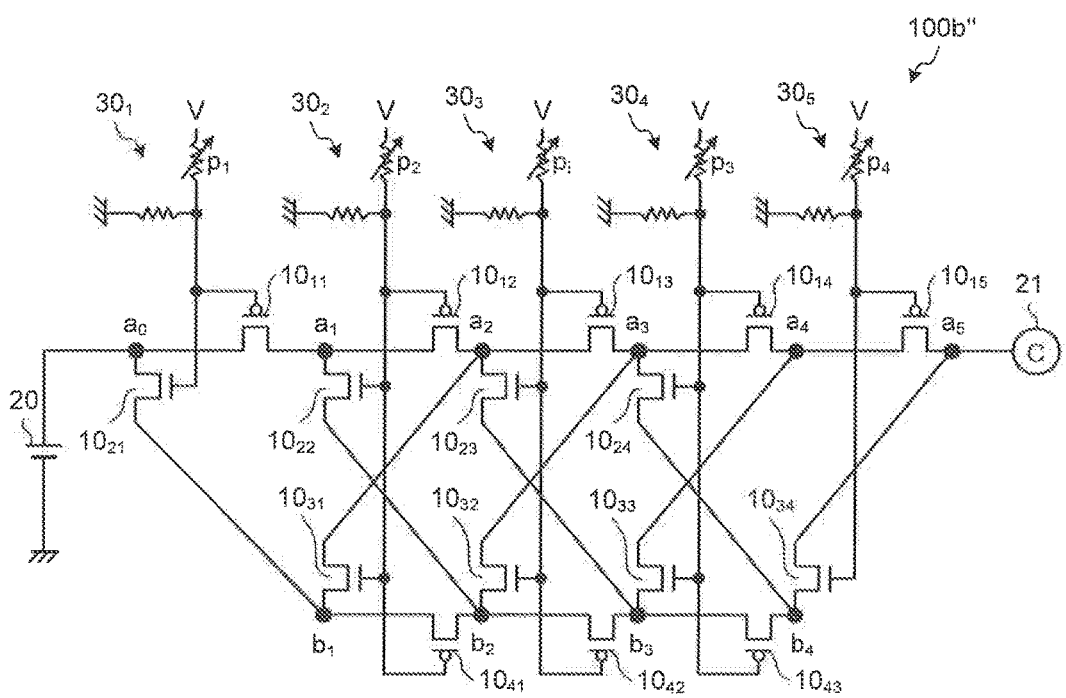

In FIGS. 19 and 20 are illustrated configurations corresponding to the configurations illustrated in FIGS. 13 and 14, respectively. That is, in FIG. 19 is illustrated an example of a check node circuit 100b' in which, in contrast to the configuration illustrated in FIG. 16, the switch units $10_{11}$ to $10_{15}$ and $10_{41}$ to $10_{43}$ that are arranged on the conducting wires in the horizontal direction of the nodes in the two-state trellis diagram are configured with NMOS transistors; and the switch units $10_{21}$ to $10_{24}$ and $10_{31}$ to $10_{34}$ that are arranged on the conducting wires in an oblique direction are configured with PMOS transistors. In this example, to the switch units $10_{11}$ and $10_{21}$ is commonly connected a probability signal generator $30_1$; and to the switch units $10_{15}$ and $10_{34}$ is commonly connected a probability signal generator $30_5$. Moreover, to the switch units $10_{12}$, $10_{22}$, $10_{31}$, and $10_{41}$ is commonly connected a probability signal generator $30_2$; to the switch units $10_{13}$, $10_{23}$, $10_{32}$, and $10_{42}$ is commonly connected a probability signal generator $30_3$; and to the switch units $10_{14}$, $10_{24}$, $10_{33}$, and $10_{43}$ is commonly connected a probability signal generator $30_4$.

In this configuration, in the check node circuit 100b', the signal V of a fixed voltage is input to the probability signal generators $30_1$ to $30_5$; and the respective resistance switch elements 300 are controlled according to the probabilities $q_1$, $q_2$, $q_i$, $q_3$, and $q_4$.

In FIG. 20 is illustrated an example of a check node circuit 100b" in which the NMOS transistors and the PMOS transistors in the switch units 10 are reversed as compared to the configuration illustrated in FIG. 19. In the check node circuit 100b", the connections of the probability signal generators $30_1$ to $30_5$ are substantially identical to the check node circuit 100b' illustrated in FIG. 19. Hence, the explanation is not repeated. However, in the check node circuit 100b", the resistance switch elements 300 corresponding to the probability signal generators $30_1$ to $30_5$ are controlled according to the probabilities $p_1$, $p_2$, $p_i$, $p_3$, and $p_4$.

First Modification Example of Third Embodiment

Given below is the explanation of a first modification example of the third embodiment. It is desirable that the voltage applied to both ends of the resistance switch element 300 for the purpose of switching the resistance switch element 300 from the high-resistance state to the low-resistance state is higher than the voltage applied for the transistor operation in the switch units 10. That is because, if the resistance switch element 300 operates during the transistor operation, there is a possibility that switching of the transistors does not occur at the desired probability. On the other hand, if the voltage applied to both ends of the resistance switch element 300 is too high, then there is a risk of destroying the transistors of the switch units 10.

Figure 21:
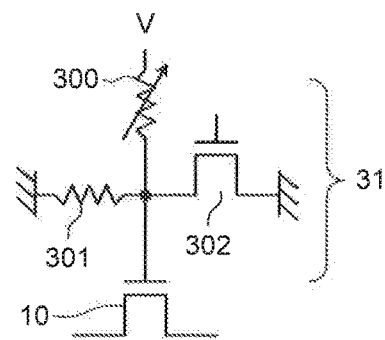
FIG. 21 is a diagram illustrating an exemplary configuration of a probability signal generator according to a first modification example of the third embodiment.

In that regard, in the first modification example of the third embodiment, as illustrated in FIG. 21, a probability signal generator 31 is configured by, for example, grounding the connection point of the resistance switch element 300 and the switch unit 10 via a switch element 302. The switch element 302 is controlled to switch to the open state only when the resistance switch element 300 is to be switched to the low-resistance state. As a result, it can be ensured that the voltage applied to the gate of the switch unit 10 does not become too high.

Figure 22:
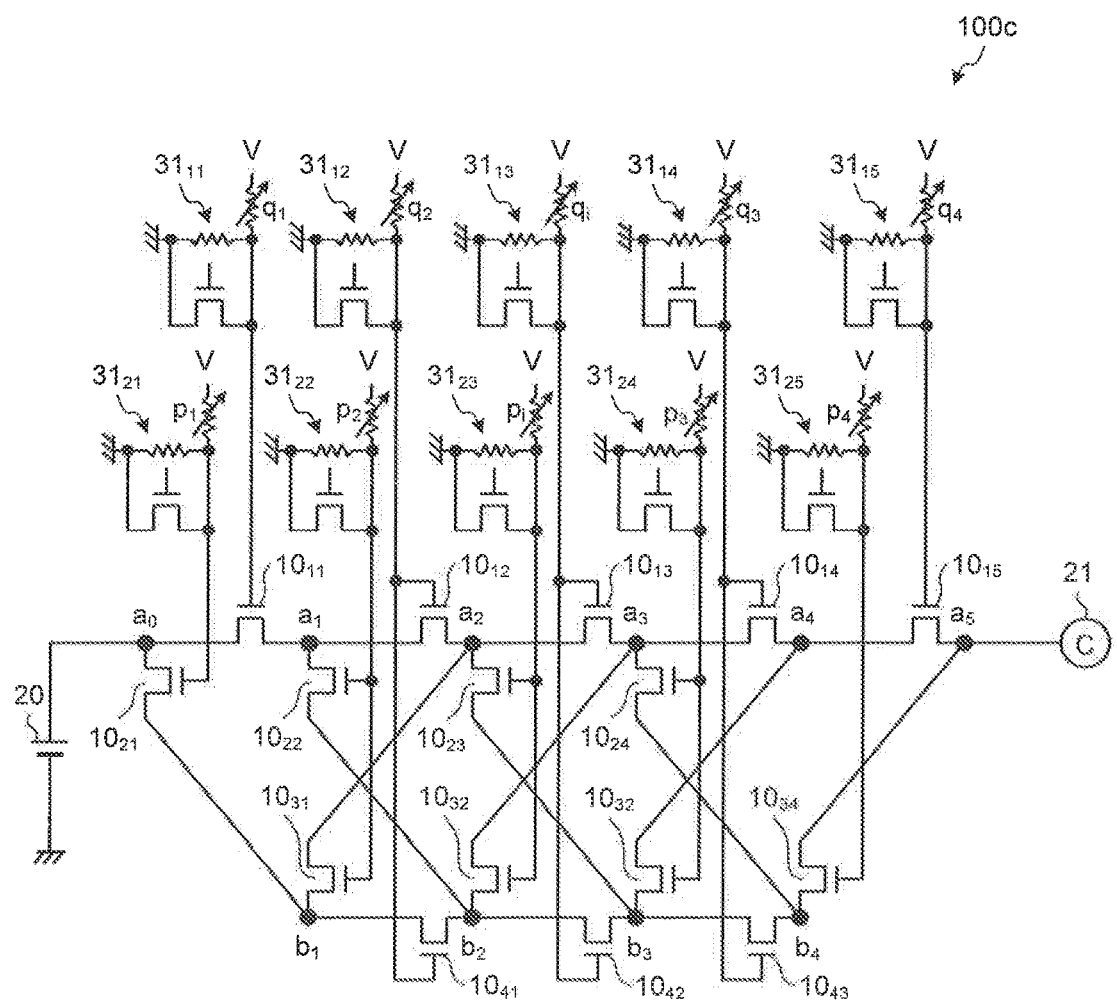
FIG. 22 is a diagram illustrating an example of a check node circuit in which the probability signal generator according to the first modification example of the third embodiment is used.

In FIG. 22 is illustrated an example of a check node circuit 100c in which the probability signal generator 31 according to the first modification example of the third embodiment is used. Thus, the check node circuit 100c is configured by substituting the probability signal generators $30_{11}$ to $30_{15}$ and $30_{21}$ to $30_{25}$ of the check node circuit 100b illustrated in FIG. 16 according to the third embodiment with probability signal generators $31_{11}$ to $31_{15}$ and $31_{21}$ to $31_{25}$ according to the first modification example of the third embodiment.

Figure 23:
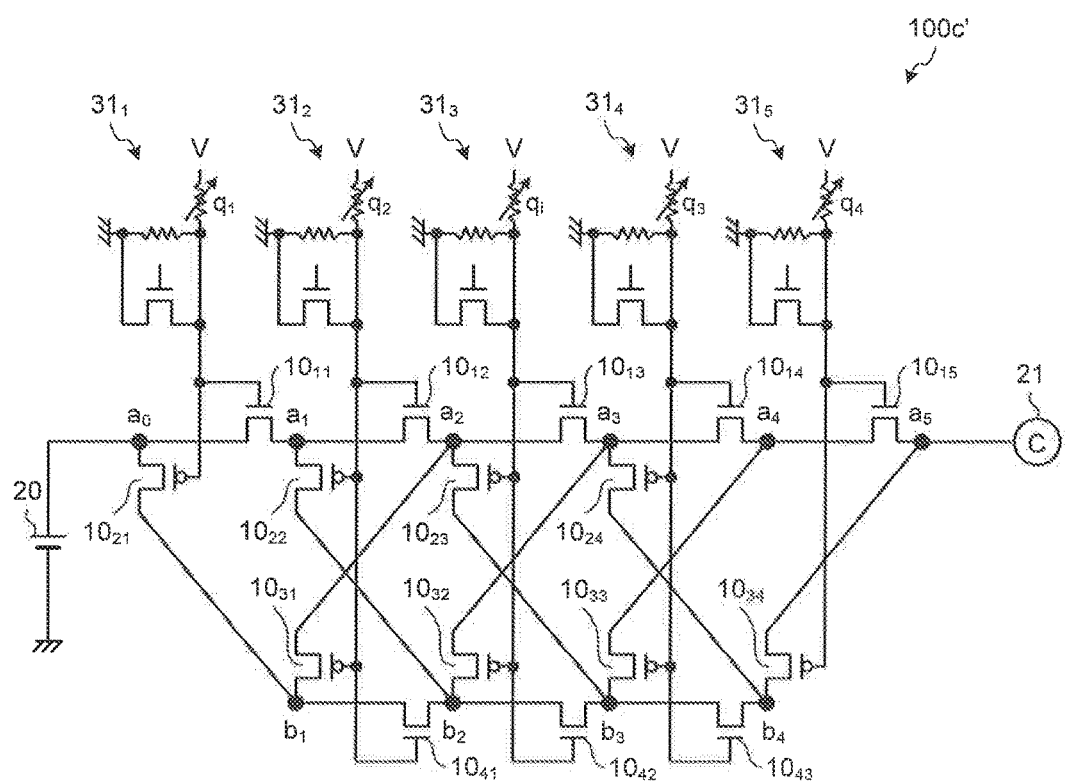
FIGS. 23, 24A and 24B are diagrams illustrating examples in which the check node circuit according to the first modification example of the third embodiment is configured with NMOS transistors and PMOS transistors.

In FIG. 23 is illustrated an example of a check node circuit 100c' in which the probability signal generators 31 are used with respect to a configuration in which the gate signals are standardized using NMOS transistors and PMOS transistors as the transistors of the switch units 10. In the example illustrated in FIG. 23, the check node circuit 100c' is configured by substituting the probability signal generators $30_1$ to $30_5$ of the check node circuit 100b' illustrated in FIG. 19 with probability signal generators $31_1$ to $31_5$ according to the first modification example of the third embodiment. Of course, that is not the only possible case. Alternatively, in the configuration illustrated in FIG. 23, NMOS transistors and PMOS transistors can be interchanged too.

In this way, even when the probability signal generators 31 according to the first modification example of the third embodiment are used, the check node processing during LDPC decoding can be implemented with a simple configuration.

Second Modification Example of Third Embodiment

Figure 24A:
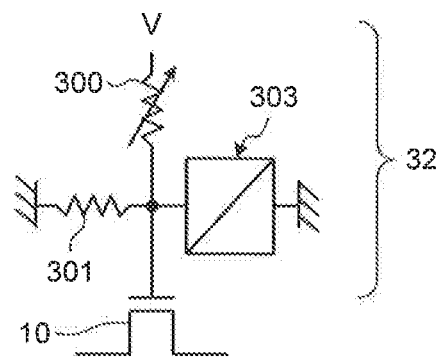

Given below is the explanation of a second modification example of the third embodiment. According to the second modification example, in the probability signal generators 31, the switch element 302 is replaced with a threshold-switch-type selector. In FIG. 24A is illustrated an exemplary configuration of a probability signal generator 32 according to the second modification example of the third embodiment. The connection point between the resistance switch element 300 and the switch unit 10 is, for example, grounded via a selector 303.

Figure 25:
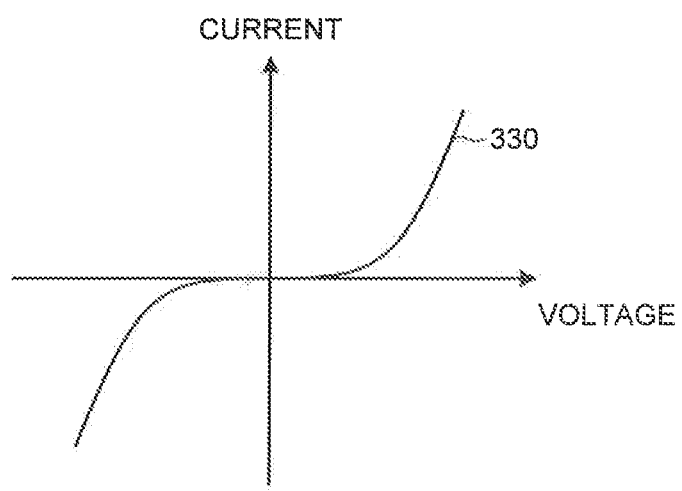
FIG. 25 is a diagram illustrating a characteristic example of a threshold-switch-type selector according to a second modification example of the third embodiment.

The threshold-switch-type selector 303 can be implemented using a capacitor made of a laminated film of a metal oxide such as $Pt/TaO_x/TiO_2/TaO_x/Pt$. In FIG. 25 is illustrated a characteristic example of the threshold-switch-type selector 303. As illustrated by a characteristic line 330 in FIG. 25, the selector 303 exhibits a strong non-linear characteristic at low voltages. Hence, there is almost no flow of current.

When the voltage exceeds the threshold voltage, the current starts flowing rapidly. Thus, the design is done in such a way that the voltage for switching to the low-resistance state is higher than the threshold voltage, and the operating voltage of the transistors of the switch units 10 is lower than the threshold voltage. As a result, it can be ensured that the gates of the switch units 10 are grounded at the time of switching to the low-resistance state, and that a voltage is applied to the gates only during the operations of the transistors of the switch units 10.

Figure 24B:
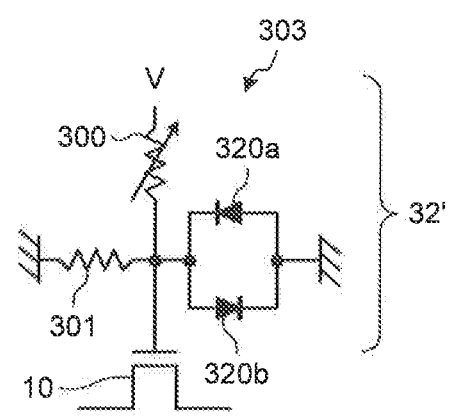

As another example of the second modification example of the third embodiment, as illustrated in a probability signal generator 32' in FIG. 24B, the selector 303 can be configured also by parallely connecting diodes 320a and 320b in mutually opposite directions. That is, the parallel connection of the diodes 320a and 320b also exhibits the characteristic as illustrated by the characteristic line 330 in FIG. 25. As the diodes 320a and 320b, it is possible to use PN-junction diodes or Schotky diodes.

Figure 26:
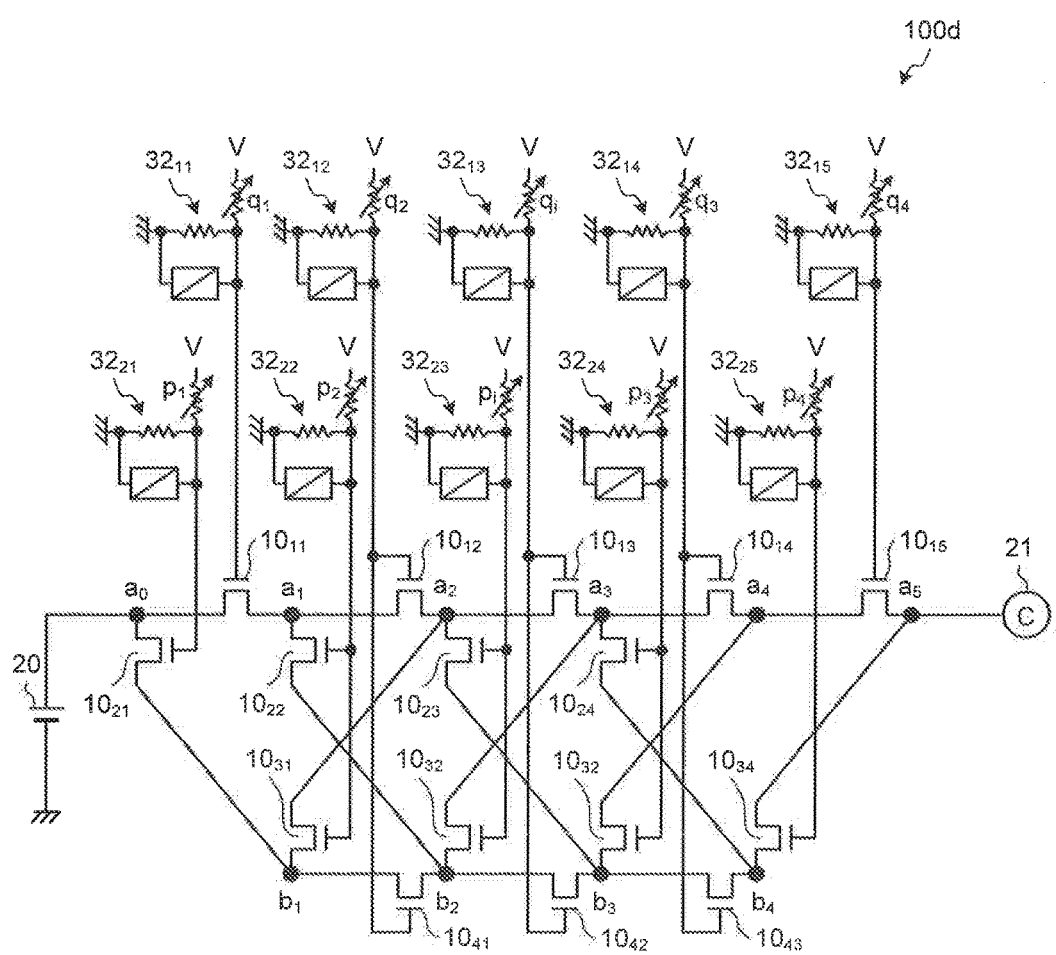
FIG. 26 is a diagram illustrating an example of a check node circuit in which the probability signal generator according to the second modification example of the third embodiment is used.

In FIG. 26 is illustrated an example of a check node circuit 100d in which the probability signal generators 32, which are configured using the threshold-switch-type selector 303, are used according to the second modification example of the third embodiment. The check node circuit 100d is configured by substituting the probability signal generators $30_{11}$ to $30_{15}$ and $30_{21}$ to $30_{25}$ of the check node circuit 100b illustrated in FIG. 16 according to the third embodiment with probability signal generators $32_{11}$ to $32_{15}$ and $32_{21}$ to $32_{25}$ according to the second modification example of the third embodiment.

Figure 27:
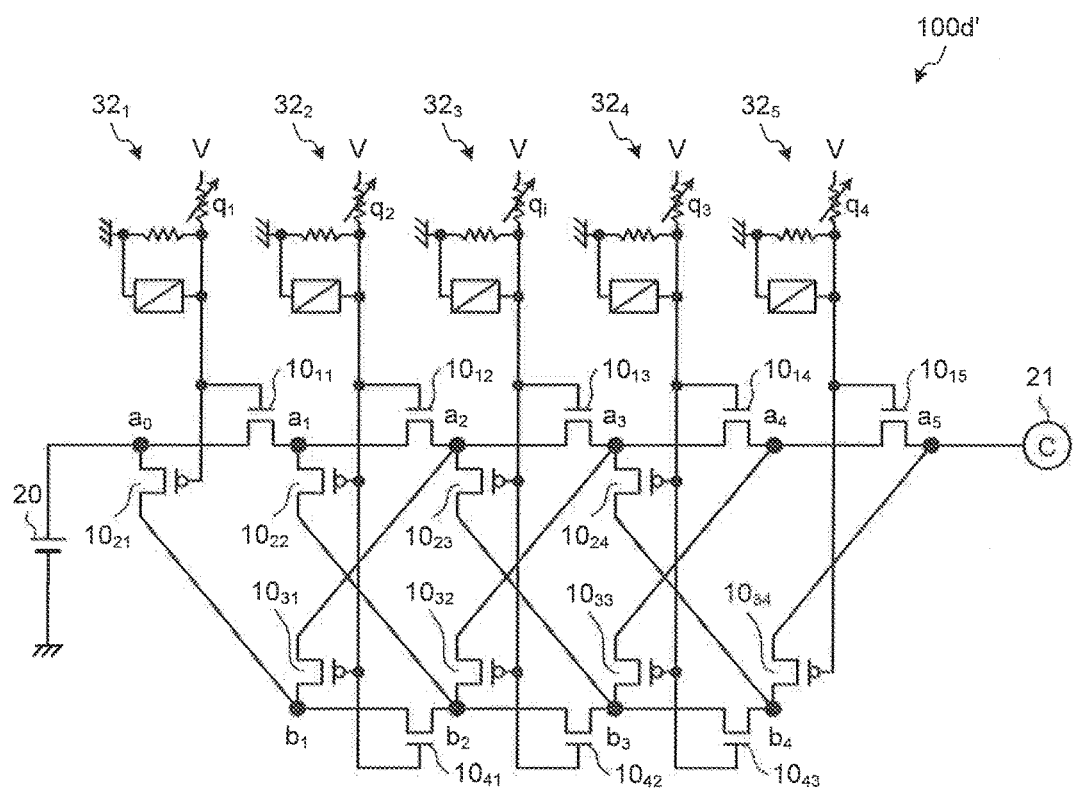
FIG. 27 is a diagram illustrating an example in which the check node circuit according to the second modification example of the third embodiment is configured with NMOS transistors and PMOS transistors.

In FIG. 27 is illustrated an example of a check node circuit 100d' in which the probability signal generators 32 are used with respect to a configuration in which the gate signals are standardized using NMOS transistors and PMOS transistors as the transistors of the switch units 10. In the example illustrated in FIG. 27, the check node circuit 100d' is configured by substituting the probability signal generators $30_1$ to $30_5$ of the check node circuit 100b' illustrated in FIG. 19 with probability signal generators $32_1$ to $32_5$ according to the second modification example of the third embodiment. Of course, that is not the only possible case. Alternatively, in the configuration illustrated in FIG. 27, NMOS transistors and PMOS transistors can be interchanged too.

Figure 28:
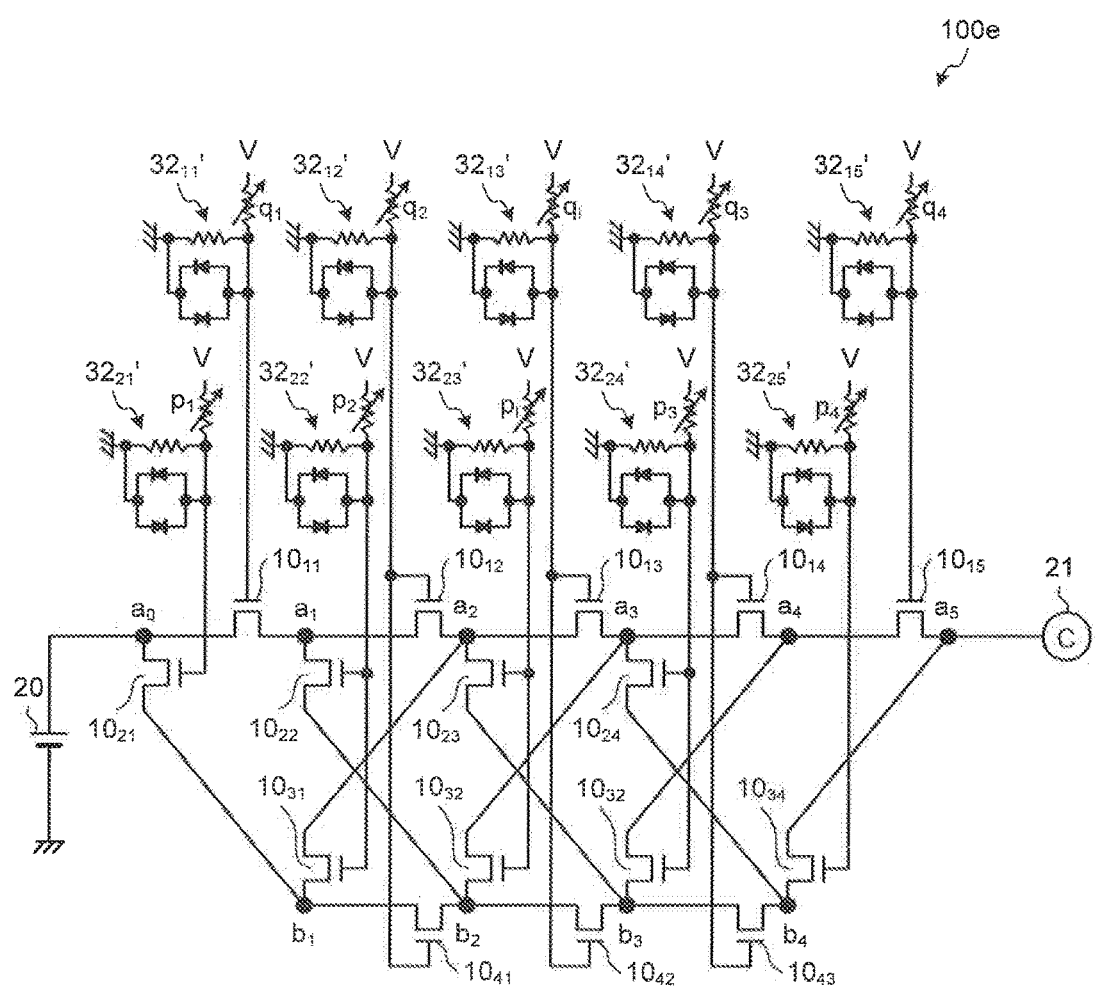
FIG. 28 is a diagram illustrating an example of a check node circuit in which the probability signal generator according to another example of the second modification example of the third embodiment is used.

In FIG. 28 is illustrated an example of a check node circuit 100e configured using the probability signal generators 32' that include the selector 303 having parallel connection of the diodes 320a and 320b. The check node circuit 100e is configured by substituting the probability signal generators $30_{11}$ to $30_{15}$ and $30_{21}$ to $30_{25}$ of the check node circuit 100b illustrated in FIG. 16 according to the third embodiment with probability signal generators $32_{11}'$ to $32_{15}'$ and $32_{21}'$ to $32_{25}'$ according to the second modification example of the third embodiment.

Figure 29:
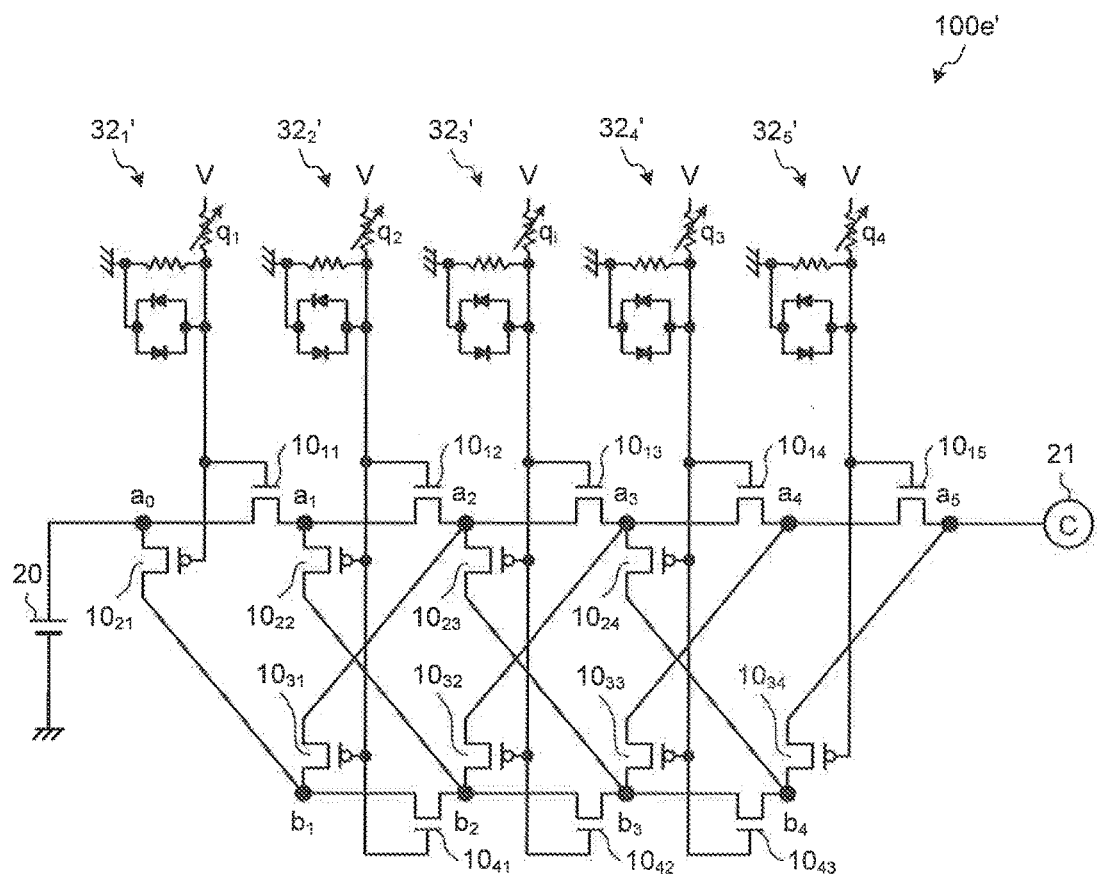
FIG. 29 is a diagram illustrating an example in which the check node circuit according to the other example of the second modification example of the third embodiment is configured with NMOS transistors and PMOS transistors.

In FIG. 29 is illustrated an example of a check node circuit 100e' in which the probability signal generators 32' are used with respect to a configuration in which the gate signals are standardized using NMOS transistors and PMOS transistors as the transistors of the switch units 10. In the example illustrated in FIG. 29, the check node circuit 100e' is configured by substituting the probability signal generators $30_1$ to $30_5$ of the check node circuit 100b' illustrated in FIG. 19 with the probability signal generators $32_1'$ to $32_5'$ according to the second modification example of the third embodiment. Of course, that is not the only possible case. Alternatively, in the configuration illustrated in FIG. 29, NMOS transistors and PMOS transistors can be interchanged too.

In this way, even when the probability signal generators 32 or the probability signal generators 32' according to the second modification example of the third embodiment are used, the check node processing during LDPC decoding can be implemented with a simple configuration.

Third Modification of Third Embodiment

Figure 30:
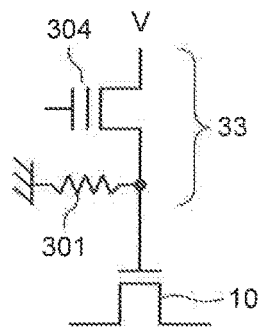
FIG. 30 is a diagram illustrating an exemplary configuration of a probability signal generator according to a third modification example of the third embodiment.

Given below is the explanation of a third modification example of the third embodiment. In the third modification example, as illustrated in FIG. 30, a probability signal generator 33 is configured using a charge-accumulating-type variable threshold transistor 304 in place of the resistance switch element 300. With reference to FIG. 30, the probability signal generator 33 is configured in which the source of the charge-accumulating-type variable threshold transistor 304 is supplied with the signal V of a predetermined voltage; the drain of the charge-accumulating-type variable threshold transistor 304 is connected to the gate of the switch unit 10; and the charge-accumulating-type variable threshold transistor 304 is, for example, grounded via the resistance 301 having the resistance value $R_0$.

The charge-accumulating-type variable threshold transistor 304 can store electrical charge inside gate electrodes, and the threshold value changes according to the accumulated electrical charge. The storage of electrical charge in the charge-accumulating-type variable threshold transistor 304 is done using the tunnel effect and injecting electrical charge in the charge storing portion via an insulator film. The tunnel effect is a quantum-mechanical effect occurring as a stochastic phenomenon. Thus, even if electrical charge is injected using the same voltage, the injected quantity of electrical charge varies in a stochastic manner, thereby leading to variability in the threshold value too. The distribution of such variability changes according to the manner of applying the voltage while injecting electrical charge. In other words, the rate, that is, the probability at which the threshold value exceeds a certain value can be controlled according to the manner of applying the voltage while injecting electrical charge in the charge-accumulating-type variable threshold transistor 304.

In that regard, for example, it is assumed that, when injection of electrical charge to the charge-accumulating-type variable threshold transistor 304 illustrated in FIG. 30 is done using an appropriate voltage, the rate at which the threshold value exceeds a certain value is 40%. When the voltage of the certain value is applied to the gate of the charge-accumulating-type variable threshold transistor 304, there is a probability of 40% at which the charge-accumulating-type variable threshold transistor 304 switches to the open state. In that state, if the signal V is input from the source of the charge-accumulating-type variable threshold transistor 304, then there is a probability of 40% at which the signal V reaches the switch unit 10 that is connected to the drain. Thus, when the switch unit 10 has an N-type transistor, there is a probability of 40% at which the switch unit 10 switches to the open state. Meanwhile, if an identical voltage is applied to the gate, then there is a probability of 60% at which the charge-accumulating-type variable threshold transistor 304 switches to the open state. In that case, the gate of the transistor of the switch unit 10 gets grounded via the resistance 301. Of course, if the switch unit 10 has a P-type transistor, there is a possibility of 60% at which the switch unit 10 switches to the closed state.

Figure 31:
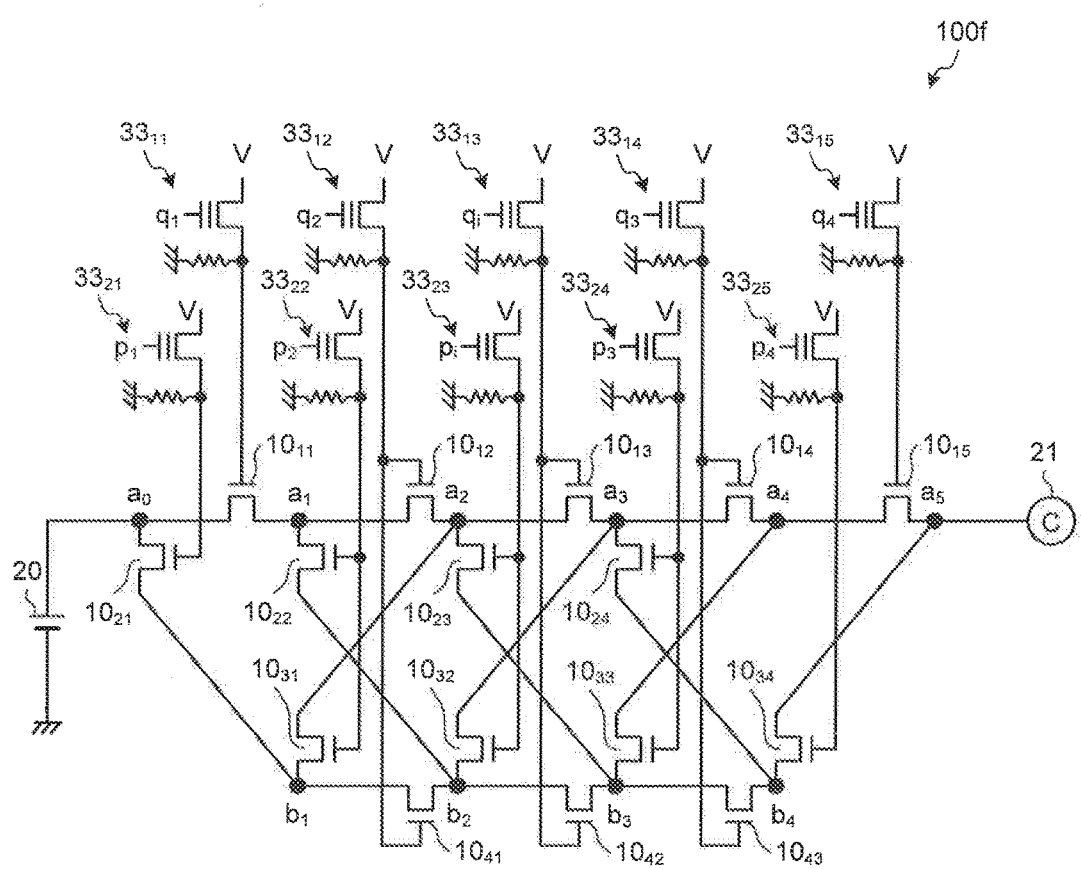
FIG. 31 is a diagram illustrating an example of a check node circuit in which the probability signal generator according to the third modification example of the third embodiment is used.

In FIG. 31 is illustrated an example of a check node circuit 100f according to the third modification example of the third embodiment and in which the probability signal generator 33 having the charge-accumulating-type variable threshold transistor 304 is used. The check node circuit 100$f$ is configured by substituting the probability signal generators $30_{11}$ to $30_{15}$ and $30_{23}$ to $30_{25}$ of the check node circuit 100$b$ illustrated in FIG. 16 according to the third embodiment with probability signal generators $33_{11}$ to $33_{15}$ and $33_{21}$ to $33_{25}$ according to the third modification example of the third embodiment.

Figure 32:
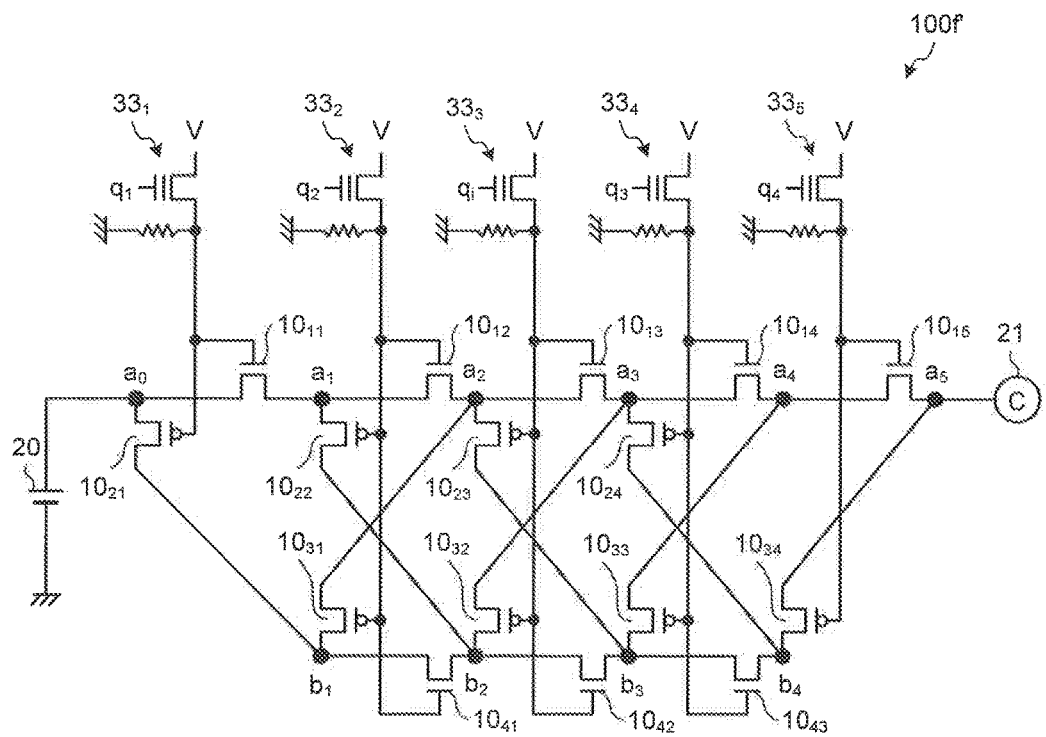
FIG. 32 is a diagram illustrating an example in which the check node circuit according to the third modification example of the third embodiment is configured with NMOS transistors and PMOS transistors.

In FIG. 32 is illustrated an example of a check node circuit 100$f'$ in which the probability signal generators 33 are used with respect to a configuration in which the gate signals are standardized using NMOS transistors and PMOS transistors as the transistors of the switch units 10. In the example illustrated in FIG. 32, the check node circuit 100$f'$ is configured by substituting the probability signal generators $30_1$ to $30_5$ of the check node circuit 100$b'$ illustrated in FIG. 19 with probability signal generators $33_1$ to $33_5$ according to the third modification example of the third embodiment. Of course, that is not the only possible case. Alternatively, in the configuration illustrated in FIG. 32, NMOS transistors and PMOS transistors can be interchanged too.

In this way, even when the probability signal generators 33 according to the third modification example of the third embodiment are used, the check node processing during LDPC decoding can be implemented with a simple configuration.

Fourth Embodiment

Figure 33:
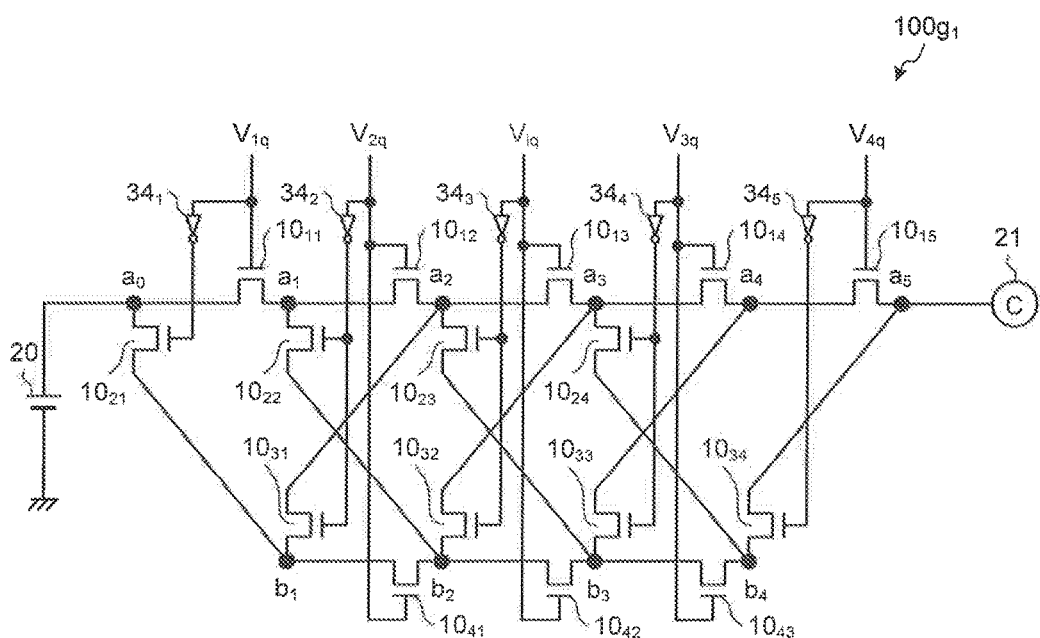
FIG. 33 is a circuit diagram illustrating an example of a check node circuit according to a fourth embodiment.

Given below is the explanation of a fourth embodiment. In the fourth embodiment, signals having complementary probabilities are generated using an inverter circuit, and the gate signals are standardized. In FIG. 33 is illustrated an exemplary configuration of a check node circuit 100$g_1$ according to the fourth embodiment. With reference to FIG. 33, the check node circuit 100$g_1$ is configured using NMOS transistors in all switch units 10; and, in each pair of switch units 10 that should complement each other, the gate of one of the switch units 10 has an inverter circuit 34 connected thereto.

More particularly, the signal $V_{1q}$ of the probability $q_1$ is input to the gate of the switch unit $10_{11}$ and is input to the gate of the switch unit $10_{21}$ via an inverter circuit $34_1$. Moreover, the signal $V_{2q}$ of the probability $q_2$ is input to the gates of the switch units $10_{12}$ and $10_{41}$ and is input to the gates of the switch units $10_{22}$ and $10_{31}$ via an inverter circuit $34_2$. In an identical manner, the signal $V_{iq}$ of the probability $q_i$ is input to the gates of the switch units $10_{13}$ and $10_{42}$ and is input to the gates of the switch units $10_{23}$ and $10_{32}$ via an inverter circuit $34_3$. Moreover, the signal $V_{3q}$ of the probability $q_3$ is input to the gates of the switch units $10_{14}$ and $10_{43}$ and is input to the gates of the switch units $10_{24}$ and $10_{33}$ via an inverter circuit $34_4$. Meanwhile, the signal $V_{4q}$ of the probability $q_4$ is input to the gate of the switch unit $10_{15}$ and is input to the gate of the switch unit $10_{34}$ via an inverter circuit $34_5$.

In such a configuration, for example, with respect to the signal $V_{2q}$, the switch units $10_{12}$ and $10_{41}$ perform switching in a complementary manner to the switch units $10_{22}$ and $10_{31}$. The same is the case regarding the other signals $V_{1q}$, $V_{iq}$, $V_{3q}$, and $V_{4q}$ too.

Moreover, the same is the case even if the signals $V_{1q}$, $V_{2q}$, $V_{iq}$, $V_{3q}$, and $V_{4q}$ too are replaced with the signals $V_{1p}$, $V_{2p}$, $V_{ip}$, $V_{3q}$, and $V_{4q}$ of the probability $p_y=1-q_y$. Meanwhile, in the example illustrated in FIG. 33, the inverter circuits $34_1$ to $34_5$ are connected to the gates of the switch units $10_{21}$ to $10_{24}$ and $10_{31}$ to $10_{34}$ that are arranged on the conducting wires connecting nodes in an oblique direction in a two-state trellis diagram. However, that is not the only possible case. Alternatively, the inverter circuits $34_1$ to $34_5$ can be connected to the gates of the switch units $10_{11}$ to $10_{15}$ and $10_{41}$ to $10_{43}$ that are arranged on the conducting wires connecting nodes in the horizontal direction in a two-state trellis diagram.

In this way, even in the case in which signals having complementary probabilities are generated using inverter circuits according to the fourth embodiment, the check node processing during LDPC decoding can be implemented with a simple configuration.

Modification Examples of Fourth Embodiment

Given below is the explanation of a modification example of the fourth embodiment. The configuration for generating signals having complementary probabilities using inverter circuits according to the fourth embodiment can be implemented in the configurations according to the third embodiment and the modification examples of the third embodiment for generating signals having complementary probabilities using NMOS transistors and PMOS transistors as the switch units 10.

Figure 34:
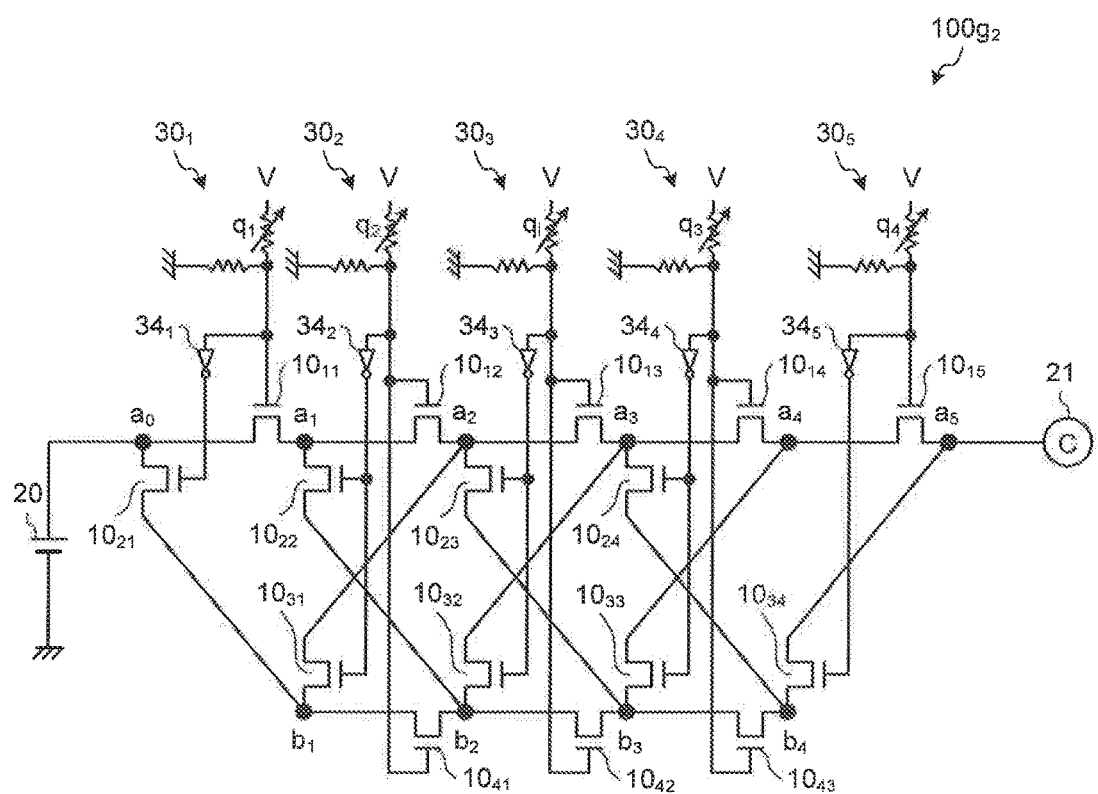
FIG. 34 is a circuit diagram illustrating an example of a check node circuit according to a first example of a modification example of the fourth embodiment.
Figure 35:
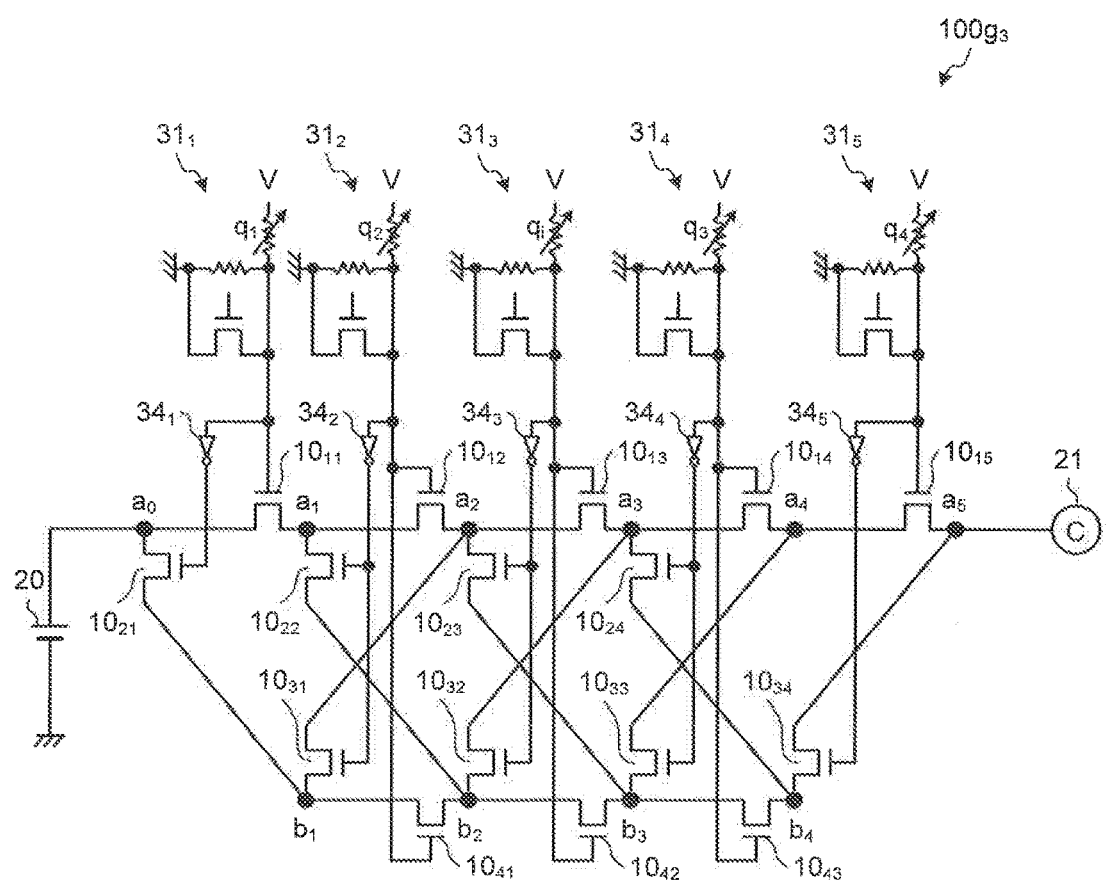
FIG. 35 is a circuit diagram illustrating an example of a check node circuit according to a second example of the modification example of the fourth embodiment.
Figure 36:
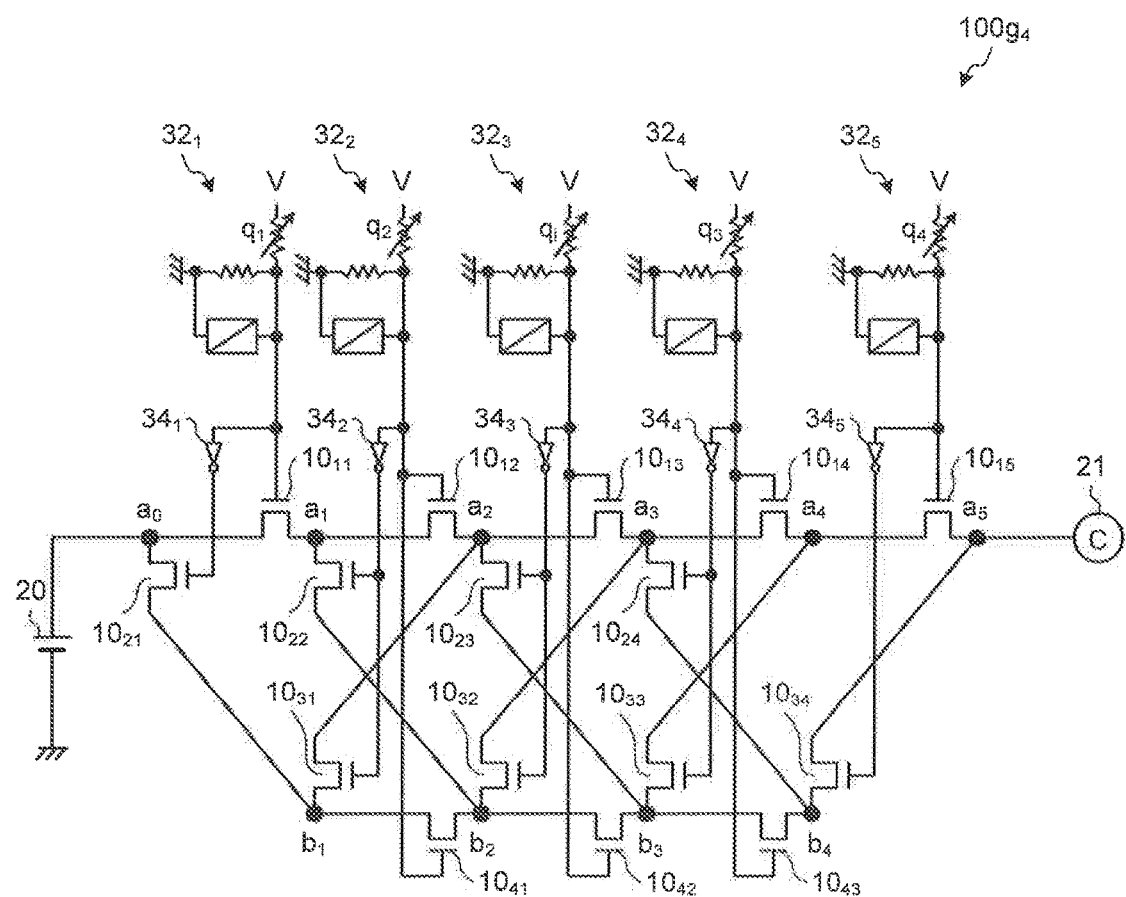
FIG. 36 is a circuit diagram illustrating an example of a check node circuit according to a third example of the modification example of the fourth embodiment.
Figure 37:
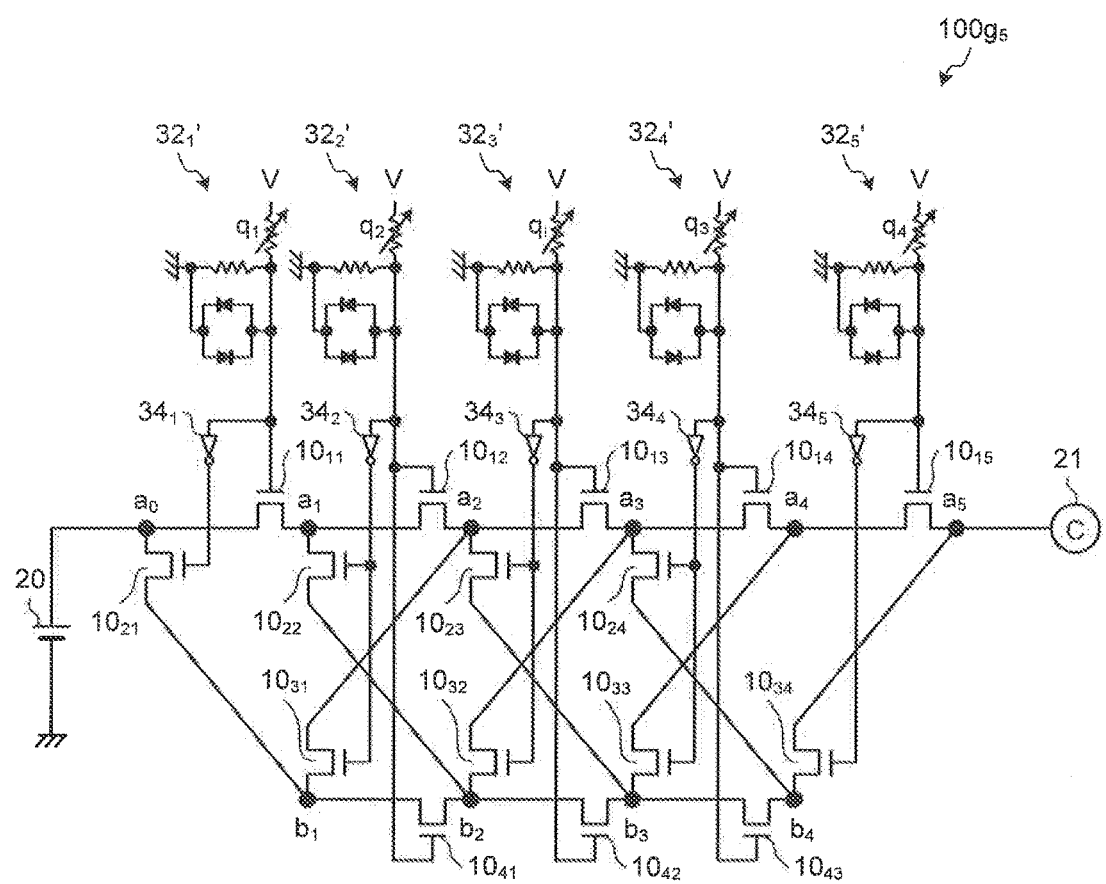
FIG. 37 is a circuit diagram illustrating an example of a check node circuit according to a fourth example of the modification example of the fourth embodiment.

In FIG. 34 is illustrated an example of a check node circuit 100$g_2$ according to a first example of the modification example of the fourth embodiment. The check node circuit 100$g_2$ illustrated in FIG. 34 is an example in which the inverter circuits $34_1$ to $34_5$ are implemented in the check node circuit 100$b'$ that is configured with the probability signal generators $30_1$ to $30_5$ including the resistance switch element 300 as illustrated in FIG. 19 according to the third embodiment. In FIG. 35 is illustrated an example of a check node circuit 100$g_3$ according to a second example of the modification example of the fourth embodiment. The check node circuit 100$g_3$ illustrated in FIG. 35 is an example in which the inverter circuits $34_1$ to $34_5$ are implemented in the check node circuit 100$c'$ that is configured with the probability signal generators $31_1$ to $31_5$ as illustrated in FIG. 23 according to the first modification example of the third embodiment. In FIG. 36 is illustrated an example of a check node circuit 100$g_4$ according to a third example of the modification example of the fourth embodiment. The check node circuit 1009$g_4$ illustrated in FIG. 36 is an example in which the inverter circuits $34_1$ to $34_5$ are implemented in the check node circuit 100$d'$ that is configured with the probability signal generators $32_1$ to $32_5$ as illustrated in FIG. 27 according to the second modification example of the third embodiment. In FIG. 37 is illustrated an example of a check node circuit 100$g_5$ according to a fourth example of the modification example of the fourth embodiment. The check node circuit 100$g_5$ illustrated in FIG. 37 is an example in which the inverter circuits $34_1$ to $34_5$ are implemented in the check node circuit 100$e'$ that is configured with the probability signal generators $32_1'$ to $32_5'$ as illustrated in FIG. 29 according to the second modification example of the third embodiment. Moreover, the inverter circuits $34_1$ to $34_5$ can also be implemented in the check node circuit 100$f'$ that is configured with the probability signal generators $33_1$ to $33_5$ according to the third modification example of the third embodiment.

In each of the configurations illustrated in FIGS. 34 to 37, the inverter circuits $34_1$ to $34_5$ are connected to the gates of the switch units $10_{21}$ to $10_{24}$ and $10_{31}$ to $10_{34}$ that are arranged on the conducting wires connecting nodes in an oblique direction in a two-state trellis diagram.

In this way, even in the case in which signals having complementary probabilities are generated using inverter circuits in a configuration for generating signals according to the probabilities using the resistance switch element 300 or the charge-accumulating-type variable threshold transistor 304, the check node processing during LDPC decoding can be implemented with a simple configuration.

Fifth Embodiment

Given below is the explanation of a fifth embodiment. The embodiments and the modification examples described above are implemented in the decoder 4 of the memory system 1 illustrated in FIG. 1. However, that is not the only possible case. That is, the embodiments and the modification examples described above can also be implemented in a communication system that sends and receives data through wired communication paths or wireless communication paths.

Figure 38:
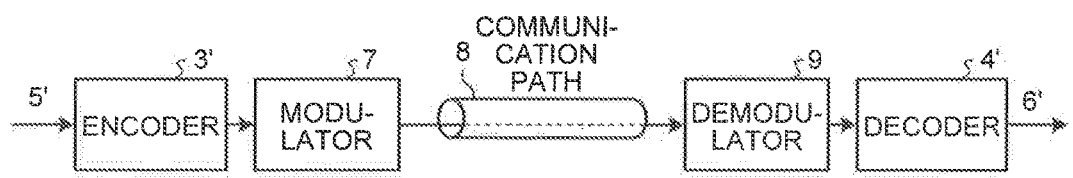
FIG. 38 is a diagram illustrating an example of a communication system that can be implemented in the fifth embodiment.

In FIG. 38 is illustrated an example of a communication system that can be implemented in the fifth embodiment. With reference to FIG. 38, input data 5' is input to an encoder 3'. Then, the encoder 3' encodes the input data 5' into an LDPC code. A modulator 7 modulates the LDPC code in the encoded form according to a method suitable for a communication path 8, and sends the modulated code as a modulation signal to the communication path 8. A demodulator 9 receives the modulation signal sent through the communication path 8, demodulates the modulation signal as digital data, and sends the digital data to the decoder 4'. At that time, the demodulator 9 sends information related to the received signal to the decoder 4'. Based on the information related to the received signal as sent by the demodulator 9, the decoder 4' obtains the bit-by-bit probability value of the digital data sent by the demodulator 9. Then, based on the obtained probability values, the decoder 4' decodes the LDPC code in the manner described in the first to fourth embodiments and the modification examples thereof, and restores the input data 5'. Subsequently, the decoder 4' outputs the restored data as output data 6'.

In this way, also in a communication system for sending and receiving information via the communication path 8, the check node processing during LDPC decoding can be implemented with a simple configuration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoding device comprising:
a probability acquirer configured to acquire a probability value for each bit of encoded data received;
a check node processor configured to perform check node processing during in a decoding operation of the encoded data, the probability values being treated as initial variable nodes in the check node processing; and
a converter configured to convert, into bit values, updated values of the probability values which are updated based on a result of the check node processing, wherein the check node processor includes a check node circuit having a topology corresponding to a two-state trellis diagram representing the check node processing,
the check node circuit includes conducting wires each corresponding to an edge of the two-state trellis diagram and includes switch units which are arranged on the conducting wires and switching of which is controlled according to a predetermined probability, and
based on presence or absence of conduction between a first terminal in the check node circuit corresponding to a starting node of the two-state trellis diagram and a second terminal in the check node circuit corresponding to an end node of the two-state trellis diagram, the check node processor performs check node processing with respect to the variable nodes corresponding to the check node circuit.

2. The decoding device according to claim 1, wherein from among the switch units that are arranged on the conducting wires corresponding to the edges for identical of the variable nodes, the check node processor performs complementary operation between first switch units that are arranged on the conducting wires corresponding to the edges connecting identical states in the two-state trellis diagram, and second switch units that are arranged on the conducting wires corresponding to the edges connecting different states in the two-state trellis diagram.

3. The decoding device according to claim 2, wherein each of the first switch units is made up of a first conductivity-type MOS transistor, and each of the second switch units is made up of a second conductivity-type MOS transistor.

4. The decoding device according to claim 3, wherein the gate of the corresponding MOS transistor in the first switch units and the second switch units is connected to a resistive element.

5. The decoding device according to claim 3, wherein the gate of the corresponding MOS transistor in the first switch units and the second switch units is connected to a charge-accumulating-type variable threshold transistor.

6. The decoding device according to claim 1, wherein each of the switch units includes a MOS transistor whose gate receives a control signal according to the predetermined probability.

7. The decoding device according to claim 6, wherein the gate of the MOS transistor in each of the switch units is connected to a resistive element.

8. The decoding device according to claim 6, wherein the gate of the MOS transistor in each of the switch units is connected to a charge-accumulating-type variable threshold transistor.

9. A decoding method comprising:
acquiring a probability value for each bit of encoded data received;
performing check node processing during in a decoding operation of the encoded data, the probability values being treated as initial variable nodes in the check node processing; and
converting, into bit values, updated values of the probability values which are updated based on a result of the check node processing, wherein
the check node processing includes performing check node processing with respect to the variable nodes corresponding to a check node circuit having a topology corresponding to a two-state trellis diagram representing the check node processing, using conducting wires and switch units of the check node circuit, the conducting wires each corresponding to an edge of the two-state trellis diagram, the switch units being arranged on the conducting wires, switching of the switch units being controlled according to a predetermined probability, based on presence or absence of conduction between a first terminal in the check node circuit corresponding to a starting node of the two-state trellis diagram and a second terminal in the check node circuit corresponding to an end node of the two-state trellis diagram.

10. A memory system comprising:
an encoder configured to encode input data and generate encoded data;
a nonvolatile memory used in storing the encoded data; and
a decoder configured to decode the encoded data which is read from the memory, wherein
the decoder includes
    a probability acquirer configured to acquire a probability value for each bit of encoded data received;
a check node processor configured to perform check node processing during in a decoding operation of the encoded data, the probability values being treated as initial variable nodes in the check node processing; and
a converter configured to convert, into bit values, updated values of the probability values which are updated based on a result of the check node processing, wherein
the check node processor includes a check node circuit having a topology corresponding to a two-state trellis diagram representing the check node processing,
the check node circuit includes conducting wires each corresponding to an edge of the two-state trellis diagram and includes switch units which are arranged on the conducting wires and switching of which is controlled according to a predetermined probability, and based on presence or absence of conduction between a first terminal in the check node circuit corresponding to a starting node of the two-state trellis diagram and a second terminal in the check node circuit corresponding to an end node of the two-state trellis diagram, the check node processor performs check node processing with respect to the variable nodes corresponding to the check node circuit.

11. The memory system according to claim 10, wherein from among the switch units that are arranged on the conducting wires corresponding to the edges for identical of the variable nodes, the check node processor performs complementary operation between first switch units that are arranged on the conducting wires corresponding to the edges connecting identical states in the two-state trellis diagram, and second switch units that are arranged on the conducting wires corresponding to the edges connecting different states in the two-state trellis diagram.

12. The memory system according to claim 11, wherein each of the first switch units is made up of a first conductivity-type MOS transistor, and each of the second switch units is made up of a second conductivity-type MOS transistor.

13. The memory system according to claim 12, wherein the gate of the corresponding MOS transistor in the first switch units and the second switch units is connected to a resistive element.

14. The memory system according to claim 12, wherein the gate of the corresponding MOS transistor in the first switch units and the second switch units is connected to a charge-accumulating-type variable threshold transistor.

15. The memory system according to claim 10, wherein each of the switch units includes a MOS transistor whose gate receives a control signal according to the predetermined probability.

16. The memory system according to claim 15, wherein the gate of the MOS transistor in each of the switch units is connected to a resistive element.

17. The memory system according to claim 15, wherein the gate of the MOS transistor in each of the switch units is connected to a charge-accumulating-type variable threshold transistor.

18. A decoding device comprising:
a probability acquirer configured to acquire a probability value for each bit of encoded data received;
a check node processor configured to perform check node processing during in a decoding operation of the encoded data, the probability values being treated as initial variable nodes in the check node processing; and
a converter configured to convert, into bit values, updated values of the probability values which are updated based on a result of the check node processing, wherein
the check node processor includes a check node circuit having a topology corresponding to a two-state trellis diagram representing the check node processing,
the check node circuit includes conducting wires each corresponding to an edge of the two-state trellis diagram and includes switch units which are arranged on the conducting wires and switching of which is controlled according to a predetermined probability.

* * * * *